(12) United States Patent
Tanaka et al.

(10) Patent No.: US 6,872,910 B2
(45) Date of Patent: Mar. 29, 2005

(54) LASER IRRADIATION APPARATUS AND METHOD OF FABRICATING A SEMICONDUCTOR DEVICE

(75) Inventors: Koichiro Tanaka, Atsugi (JP); Tomoko Nakaya, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 53 days.

(21) Appl. No.: 10/406,293

(22) Filed: Apr. 4, 2003

(65) Prior Publication Data

US 2003/0190797 A1 Oct. 9, 2003

Related U.S. Application Data

(62) Division of application No. 09/741,026, filed on Dec. 21, 2000, now Pat. No. 6,573,162.

(30) Foreign Application Priority Data

Dec. 24, 1999 (JP) ............................................. 11-367030

(51) Int. Cl.[7] .............................................. B23K 26/00
(52) U.S. Cl. ................................ 219/121.6; 219/121.78
(58) Field of Search ......................... 219/121.6, 121.78, 219/121.79, 121.8, 121.85

(56) References Cited

U.S. PATENT DOCUMENTS

| | | | |
|---|---|---|---|
| 4,330,363 A | 5/1982 | Biegesen et al. | |
| 4,475,027 A | 10/1984 | Pressley | |
| 4,733,944 A | 3/1988 | Fahlen et al. | |
| 4,974,919 A | * 12/1990 | Muraki et al. | 359/204 |
| 5,005,969 A | 4/1991 | Kataoka | |
| 5,055,969 A | 10/1991 | Putnam | |
| 5,494,781 A | * 2/1996 | Ohtani et al. | 430/313 |
| 5,561,081 A | 10/1996 | Takenouchi et al. | |
| 5,643,826 A | 7/1997 | Ohtani et al. | |
| 5,923,962 A | 7/1999 | Ohtani et al. | |
| 6,100,961 A | 8/2000 | Shiraishi et al. | |
| 6,137,633 A | 10/2000 | Tanaka | |
| 6,160,827 A | 12/2000 | Tanaka | |
| 6,176,926 B1 | 1/2001 | Tanaka | |
| 6,212,012 B1 | 4/2001 | Tanaka | |
| 6,215,595 B1 | 4/2001 | Yamazaki et al. | |
| 6,239,913 B1 | 5/2001 | Tanaka | |
| 2001/0005606 A1 | 6/2001 | Tanaka et al. | |

OTHER PUBLICATIONS

Hayashi et al., "Fabrication of Low–Temperature Bottom–gate Poly–Si TFTs on Large–area Substrate by Linear–beam Excimer Laser Crystallization and Ion Doping Method," International Electron Devices Meeting, 1995, pp. 829–832.

(Continued)

Primary Examiner—M. Alexandra Elve
(74) Attorney, Agent, or Firm—Eric J. Robinson; Robinson Intellectual Property Law Office, P.C.

(57) ABSTRACT

There is provided an optical system for reducing faint interference observed when laser annealing is performed to a semiconductor film. The faint interference conventionally observed can be reduced by irradiating the semiconductor film with a laser beam by the use of an optical system using a mirror of the present invention. The optical system for transforming the shape of the laser beam on an irradiation surface into a linear or rectangular shape is used. The optical system may include an optical system serving to convert the laser beam into a parallel light with respect to a traveling direction of the laser beam. When the laser beam having passed through the optical system is irradiated to the semiconductor film through the mirror of the present invention, the conventionally observed faint interference can be reduced. Besides, the optical system which has been difficult to adjust can be simplified.

14 Claims, 32 Drawing Sheets

OTHER PUBLICATIONS

Inventor: Koichiro Tanaka, Specifications and Drawings of U.S. Appl. No. 09/637,905, Filed: Aug. 14, 2000, "Laser Irradiation Device."

Endert et al., "Excimer Laser: A New Tool for Precision Micromachining," Optical and Quantum Electronics, vol. 27, pp. 1319–1335, 1995.

Helen et al., "Reproducible High Field Effect Mobility Polysilicon Thin Film Transistors Involving Pulsed Nd:YVO$_4$ Laser Crystallization," International Electron Devices Meeting 1999, Technical Digest, IEEE, NJ, USA.

U.S. Appl. No. 09/744,637, including specification, drawings, filing receipt and pending claims, "Beam Homogenizer, Laser Irradiation Apparatus, Semiconductor Device, and Method of Fabricating the Semiconductor Device."Koichiro Tanaka, Feb. 1, 2001.

* cited by examiner

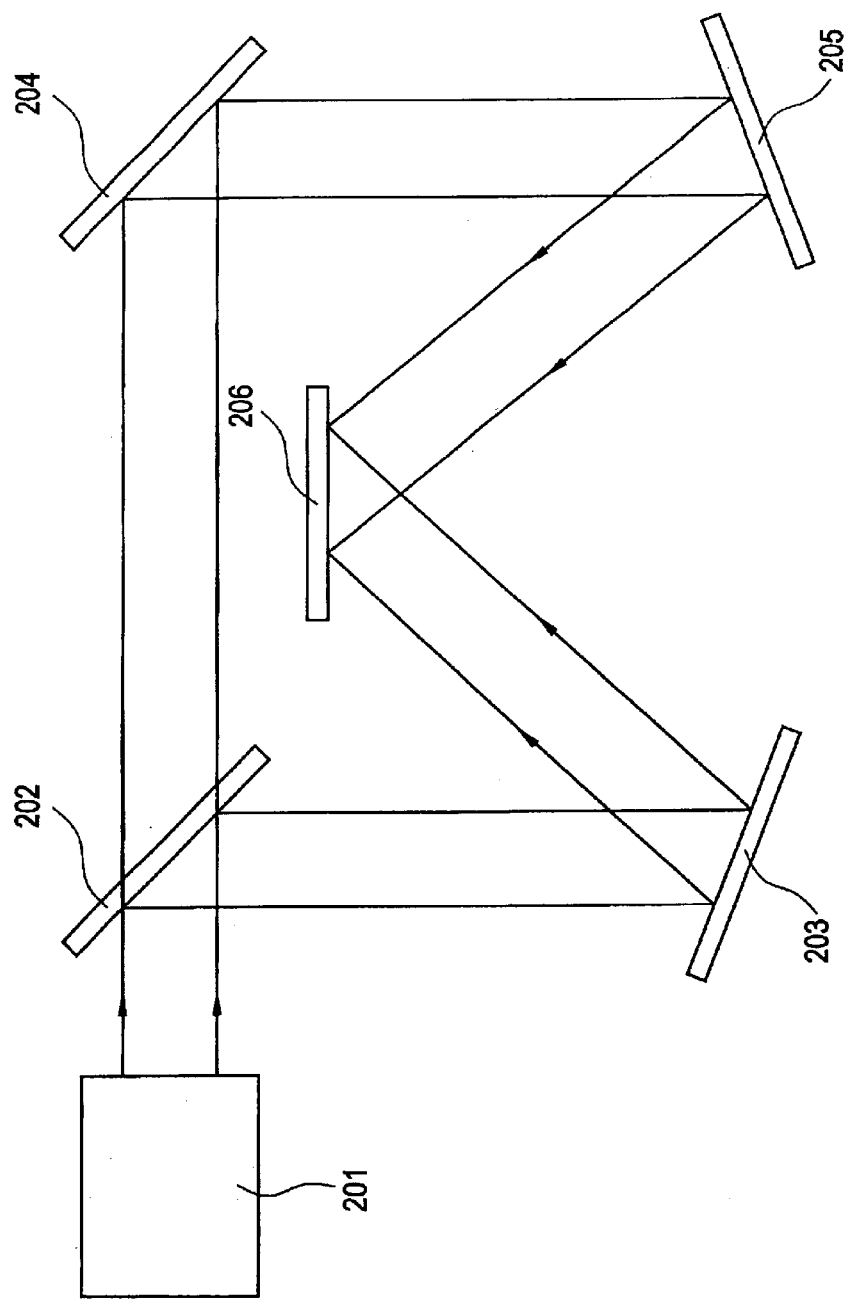

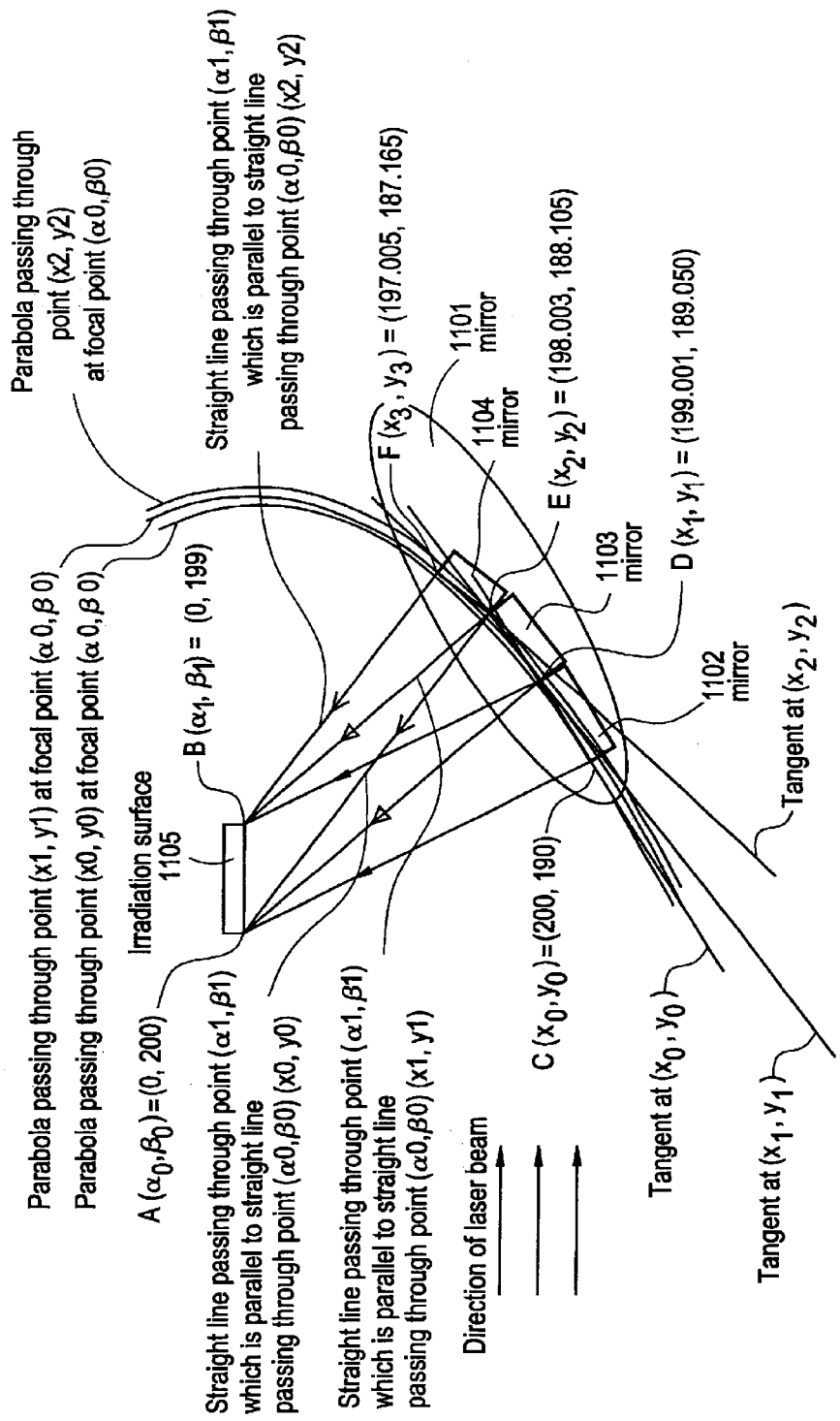

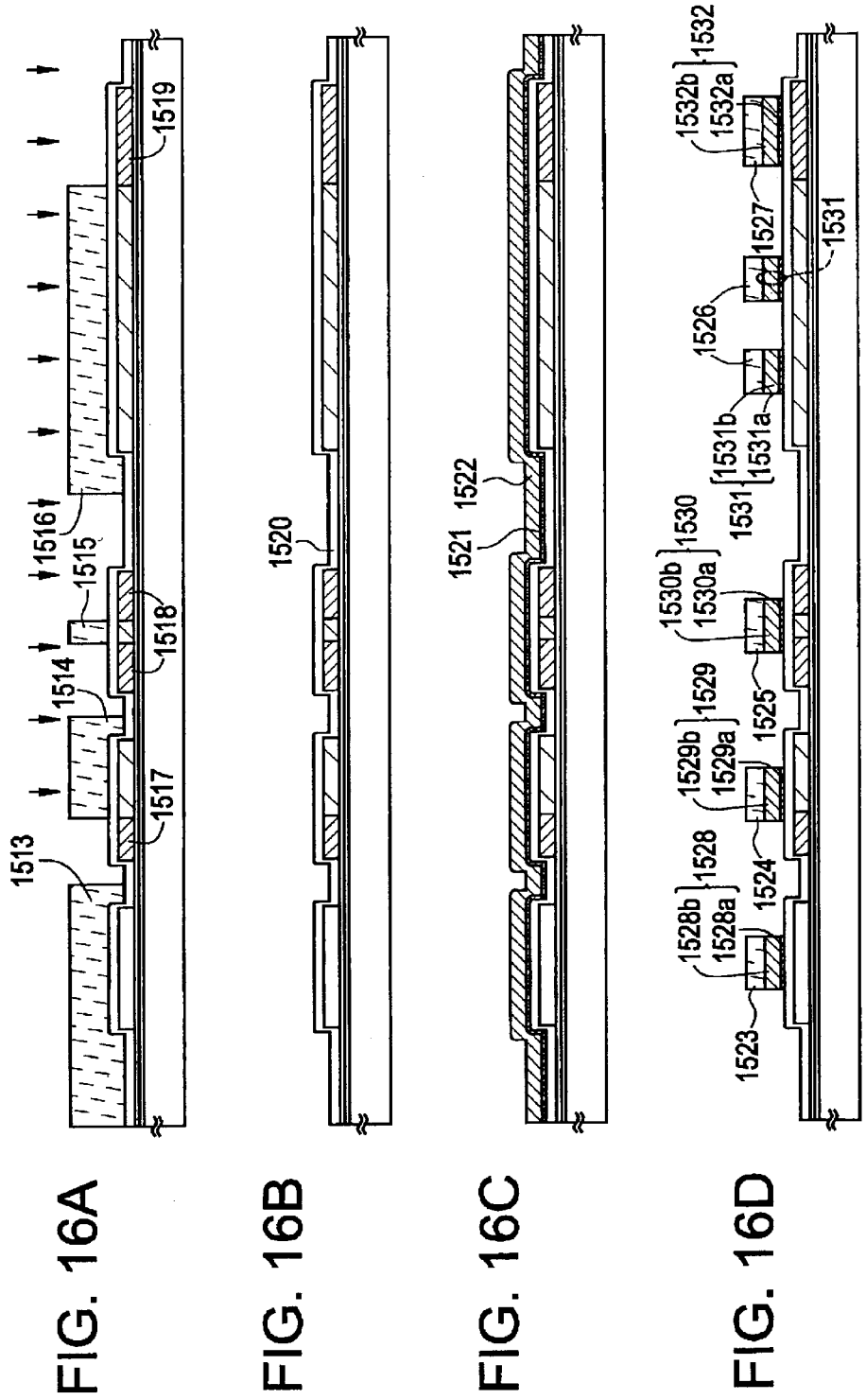

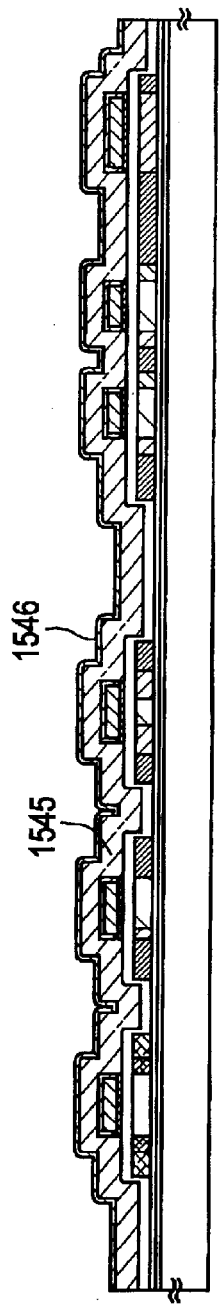
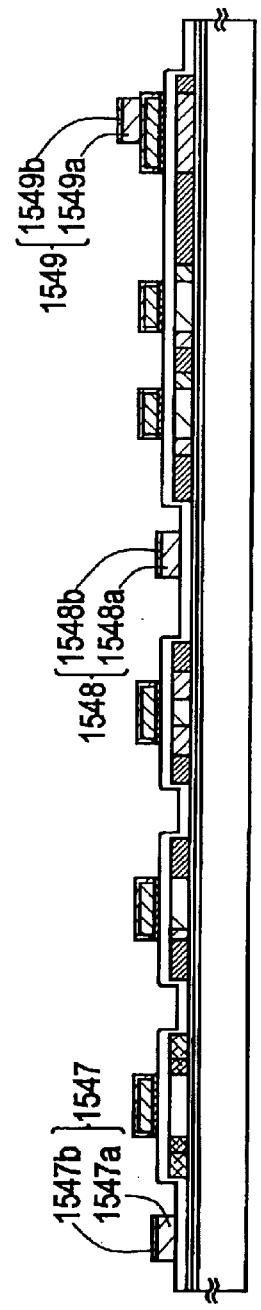
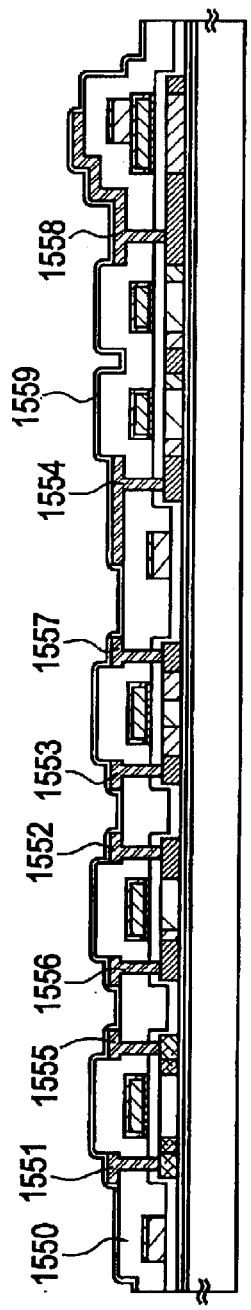
FIG. 18A
FIG. 18B
FIG. 18C

Step of forming amorphous semiconductor film

Step of adding catalyst element

Laser crystallization step

Step of forming amorphous semiconductor film

Step of adding catalyst element

Crystallization step (thermal crystallization)

Laser annealing step

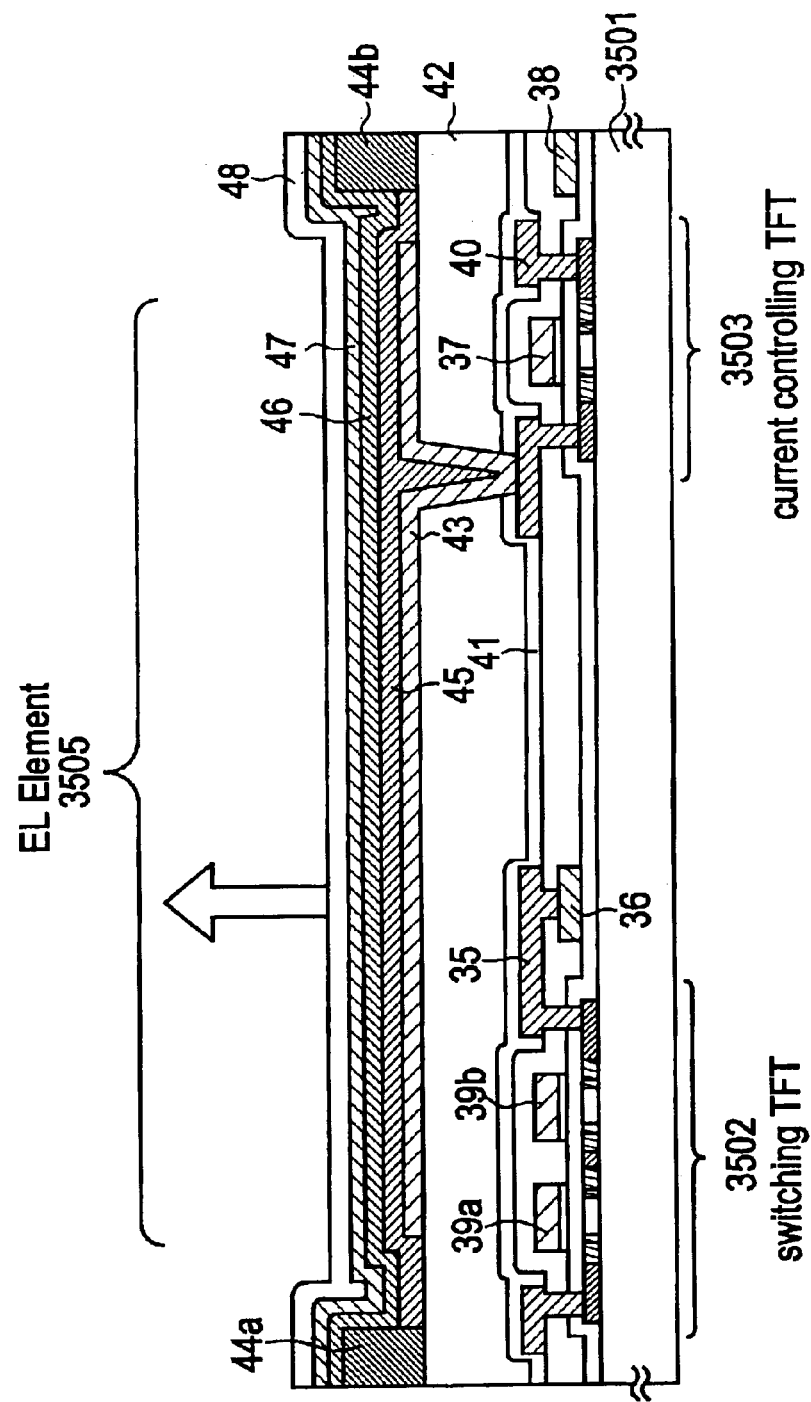

LASER IRRADIATION APPARATUS AND METHOD OF FABRICATING A SEMICONDUCTOR DEVICE

BACKGROUND OF THE INVENTION

1. Field of the Invention

The present invention relates to an apparatus for manufacturing a semiconductor device having a circuit structured with a thin film transistor. For example, the invention relates to an apparatus for manufacturing an electro-optical device, typically a liquid crystal display device, and the structure of electric equipment mounted with such an electro-optical device as a component. The present invention also relates to a method of fabricating the apparatus. Note that throughout this specification, the semiconductor device indicates general devices that may function by use of semiconductor characteristics, and that the above electro-optical device and electric equipment are categorized as the semiconductor device.

2. Description of the Related Art

In recent years, the technique of crystallizing and improving the crystallinity of a semiconductor film formed on an insulating substrate such as a glass substrate by laser annealing, has been widely researched. Silicon is often used as the above semiconductor film.

Comparing a glass substrate with a quartz substrate, which is often used conventionally, the glass substrate has advantages of low-cost and great workability, and can be easily formed into a large surface area substrate. This is why the above research is performed. Also, the reason for preferably using laser annealing for crystallization resides in that the melting point of a glass substrate is low. Laser annealing is capable of imparting high energy only to the semiconductor film without causing much change in the temperature of the substrate.

The crystalline semiconductor film is formed from many crystal grains. Therefore, it is called a polycrystalline semiconductor film. A crystalline semiconductor film formed by laser annealing has high mobility. Accordingly, it is actively used in, for example monolithic type liquid crystal electro-optical devices where thin film transistors (TFTs) are formed using this crystalline semiconductor film and fabricate TFTs for driving pixels and driver circuits formed on one glass substrate.

Furthermore, a method of performing laser annealing is one in which a pulse laser beam emitted from a excimer laser or the like, is processed by an optical system so that the laser beam thereof becomes a linear shape that is 10 cm long or greater or a square spot that is several cm square at an irradiated surface to thereby scan the laser beam (or relatively move the irradiation position of the laser beam to the irradiated surface). Because this method is high in productivity and industrially excellent, it is being preferably employed.

Different from when using a spot shape laser beam which requires a front, back, left, and right scan on an irradiated surface, when using the linear beam, the entire irradiated surface can be irradiated by the linear beam which requires only scanning at a right angle direction to the linear direction of the linear beam, resulting in the attainment of a high productivity. To scan in a direction at a right angle to the linear direction is the most effective scanning direction. Because a high productivity can be obtained, using the linear beam which is linear in the irradiated surface that is emitted from the pulse oscillation type excimer laser and processing it into a linear beam by an appropriate optical system for laser annealing at present is becoming mainstream.

Shown in FIG. 1 is an example of the structure of an optical system for linearizing the shape of a laser beam on the irradiated surface. This structure is a very general one and all aforementioned optical systems conform to the structure of the optical system shown in FIG. 1. This structure of the optical system not only transforms the shape of the laser beam in the irradiated surface into a linear shape, but also homogenizes the energy of the laser beam in the irradiated surface at the same time. Generally, an optical system that homogenizes the energy of a beam is referred to as a beam homogenizer.

If the excimer laser, which is ultraviolet light, is used as the light source, then the core of the above-mentioned optical system may be preferably made of, for example, entirely quartz. The reason for using quartz resides in that a high transmittance can be obtained. Further, it is preferable to use a coating in which a 99% or more transmittance can be obtained with respect to a wavelength of the excimer laser that is used.

The side view of FIG. 1 will be explained first. Laser beam emitted from a laser oscillator 101 is split at a right angle direction to the advancing direction of the laser beam by cylindrical lens arrays 102a and 102b. The direction is referred to as a longitudinal direction throughout the present specification. When a mirror is placed along the optical system, the laser beams in the longitudinal direction will curve in the direction of light curved by the mirror. These laser beams in this structure are split into 4 beams. The split laser beams are then converged into 1 beam by a cylindrical lens 104. Then, the converged laser beam are split again and reflected at a mirror 107. Thereafter, the split laser beams are again converged into 1 laser beam at an irradiated surface 109 by a doublet cylindrical lens 108. A doublet cylindrical lens is a lens that is constructed of 2 pieces of cylindrical lenses. Thus, the energy in the width direction of the linear laser beam is homogenized and the length of the width direction of the linear beam is also determined.

The top view of FIG. 1 will be explained next. Laser beam emitted from the laser oscillator 101 is split at a right angle direction to the advancing direction of the laser beam and at a right angle direction to the longitudinal direction by a cylindrical lens array 103. The right angle direction is called a vertical direction throughout the present specification. When a mirror is placed along the optical system, the laser beams in the vertical direction will curve in the direction of light curved by the mirror. The laser beams in this structure is split into 7 beams. Thereafter, the split laser beams are converged into 1 beam at the irradiated surface 109 by the cylindrical lens 104. Thus, homogenization of the energy in the longitudinal direction of the linear beam is made and the length of the longitudinal direction is also determined.

The above lenses are made of synthetic quartz for correspondence to excimer laser. Furthermore, coating is implemented on the surfaces of the lenses so that the excimer laser will be well transmitted. Therefore, the transmittance of excimer laser through each lens is 99% or more.

By irradiating the linear beam linearized by the above structure of the optical system in an overlapping manner with a gradual shift in the width direction thereof, laser annealing is implemented to the entire surface of a semiconductor film to thereby crystallize the semiconductor film and thus its crystallinity can be enhanced.

A typical method of manufacturing a semiconductor film that is to become the object to be irradiated is shown next. First, for example, a 5 inch square Corning 1737 substrate having a thickness of 0.7 mm is prepared as the substrate. Then a 200 nm-thick $SiO_2$ film (silicon oxide film) is formed on the substrate and a 50 nm-thick amorphous silicon film is formed on the surface of the $SiO_2$ film. The substrate is exposed under an atmosphere containing nitrogen gas at a temperature of 500° C. for 1 hour to thereby reduce the hydrogen concentration in the film. Accordingly, the laser resistance in the film is remarkably improved.

The XeCl excimer laser L3308 (wavelength: 308 nm, pulse width: 30 ns) manufactured by Lambda Co. is used as the laser apparatus. This laser apparatus generates a pulse oscillation laser and has the ability to output an energy of 500 mJ/pulse. The size of the laser beam at the exit of the laser beam is 10×30 mm (both half-width). Throughout the present specification, the exit of the laser beam is defined as the perpendicular plane in the advancing direction of the laser beam immediately after the laser beam is emitted from the laser irradiation apparatus.

The shape of the laser beam generated by the excimer laser is generally rectangular and is expressed by an aspect ratio which falls under the range of the order of 3 to 5. The intensity of the laser beam grows stronger towards the center of the beam and indicates the Gaussian distribution. The size of the laser beam processed by the optical system having the structure shown in FIG. 1 is transformed into a 125 mm×0.4 mm linear beam having a uniform energy distribution.

When irradiating a laser beam to the above-mentioned semiconductor film, the most suitable overlapping pitch is approximately 1/10 of the beam width (half-width) of the linear beam. The uniformity of the crystallinity in the film is thus improved. In the above example, the half-width of the linear laser beam was 0.4 mm, and therefore the pulse frequency of the excimer laser was set to 30 hertz and the scanning speed was set to 1.0 mm/s to thereby irradiate the laser beam. At this point, the energy density in the irradiated surface of the laser beam was set to 420 mJ/cm$^2$. The method described so far is a very general method employed for crystallizing a semiconductor film by using a linear beam.

When an extremely attentive observation is made to a semiconductor film that has been laser annealed by using the above-mentioned linear beam, very faint interference patterns were seen in the film. The cause of the interference patterns seen in the film resides in that the laser beam is split and assembled in one region, and therefore the split light brings about interference with each other. The coherent length of the excimer laser is about several $\mu$m to several tens of $\mu$m.

SUMMARY OF THE INVENTION

When a laser annealing is performed to a semiconductor film by using a conventional optical system, since faint interference is seen, an optical system in which interference is suppressed is provided according to the present invention. Besides, although the conventional optical system is complicated as shown in FIG. 1, according to the present invention, a uniform laser beam can be obtained by an optical system mainly including a beam collimator for transforming a laser beam into a parallel light and a reflecting mirror, and it is also possible to simplify the optical system for forming the laser beam having a linear or rectangular shape on an irradiation surface.

A laser beam has a feature that even if laser beams are emitted from the same light source, they do not interfere with each other if there is an optical path difference equal to or longer than a coherent length. First, an explanation will be made with reference to FIG. 2. FIG. 2 shows a laser oscillator 201, a half mirror 202, mirrors 203 to 205, and an irradiation surface 206. It is assumed that the distance between the half mirror 202 and the mirror 203 is equal to the distance between the mirror 204 and the mirror 205, and the distance between the mirror 203 and the irradiation surface 206 is equal to the distance between the mirror 205 and the irradiation surface 206. A laser beam emitted from the laser oscillator 201 is divided by the half mirror 202 into a laser beam transmitted through the half mirror and traveling straight and a laser beam traveling in a direction perpendicular to the original traveling direction. After the laser beam bent to the perpendicular direction is reflected by the mirror 203, it reaches the irradiation surface 206. On the other hand, the laser beam transmitted through the half mirror 202 reaches the irradiation surface 206 through the mirrors 204 and 205.

In this way, although the laser beams divided by the half mirror in the two directions are assembled again to make one beam at or in the vicinity of the irradiation surface 206, the distance from the half mirror 202 to the mirror 204 is an optical path difference of the laser beams divided in two. In the case where this optical path difference is longer than the coherent length of the laser beam, interference at the irradiation surface does not occur.

For example, in the case where an excimer laser is used as the laser oscillator 201, since the coherent length of the excimer laser is about several $\mu$m to several tens of $\mu$m, if the distance from the half mirror 202 to the mirror 204 is several mm, the interference does not occur at the irradiation surface 206. In the case where a YAG laser is used as the laser oscillator 201, since the coherent length of the YAG laser is longer than the coherent length of the excimer laser, if the distance from the half mirror 202 to the mirror 204 is made longer than that in the case of the excimer laser, the interference at the irradiation surface 206 does not occur.

BRIEF DESCRIPTION OF THE DRAWINGS

In the accompanying drawings:

FIG. 2 is a diagram showing the laser beam split into two directions by the half mirror to be assembled into one on the irradiated surface;

FIG. 11 is a diagram showing an example of displacement of a mirror disclosed in the present invention;

FIGS. 16A to 16D are diagrams showing an example of a manufacturing process of a pixel TFT and a TFT of a driver circuit;

FIGS. 18A to 18C are diagrams showing an example of a manufacturing process of a pixel TFT and a TFT of a driver circuit;

FIG. 26 is a diagram showing the structure of an active matrix EL display device;

DETAILED DESCRIPTION OF THE PREFERRED EMBODIMENTS

Embodiment Mode of the Invention

Figure 1A:
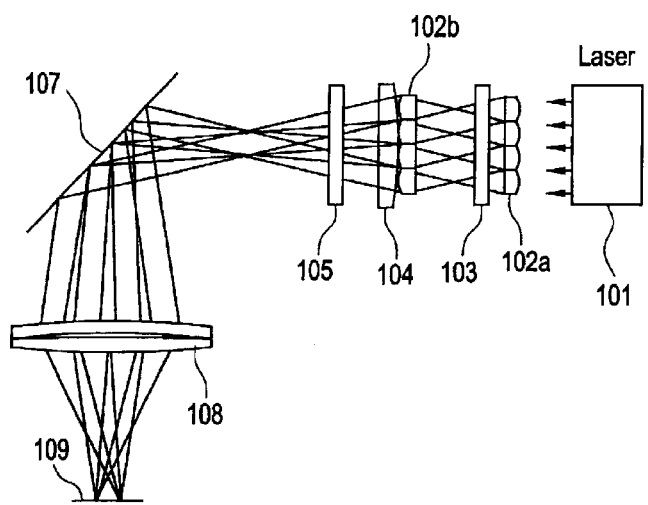
FIG. 1 are diagrams showing a side view and a top view, respectively, of a conventional optical system that forms a linear beam.
Figure 1B:
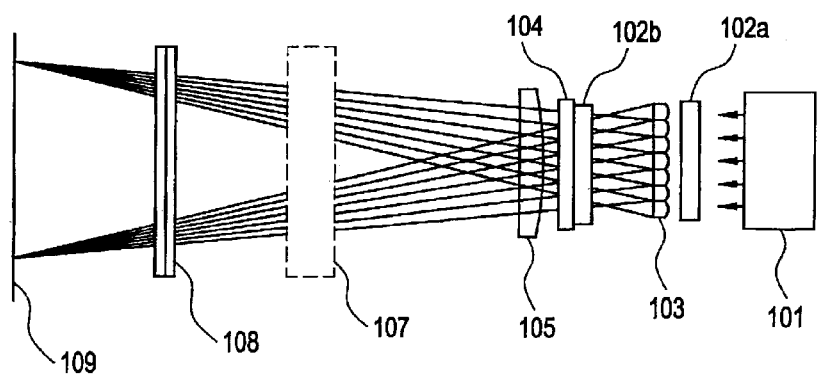
Figure 3A:
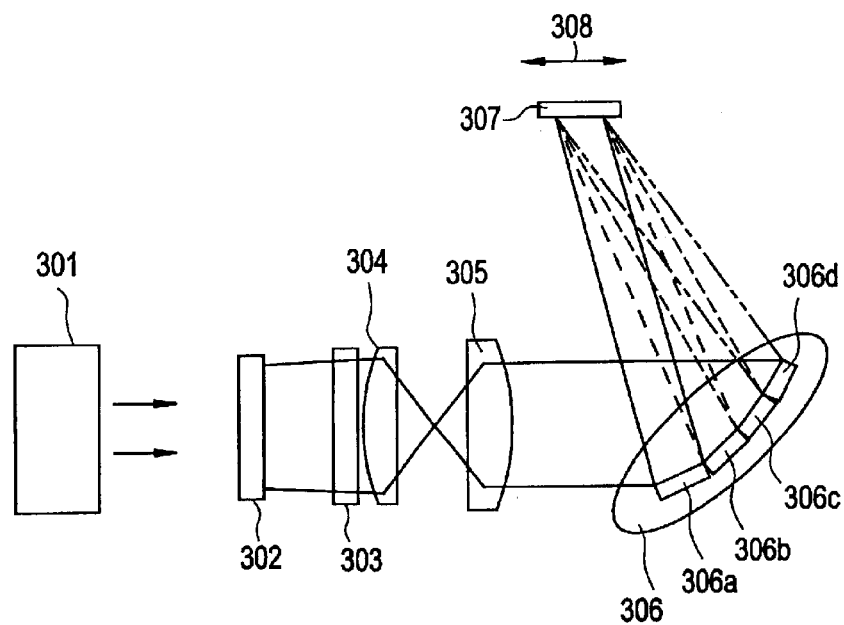
FIG. 3 are diagrams showing an example of a laser irradiation apparatus disclosed in the present invention.
Figure 3B:
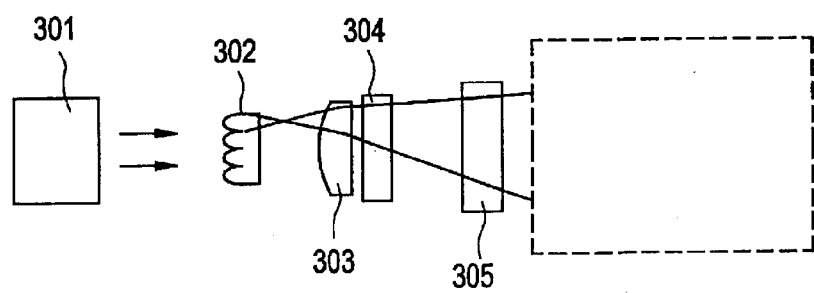
Figure 4A:
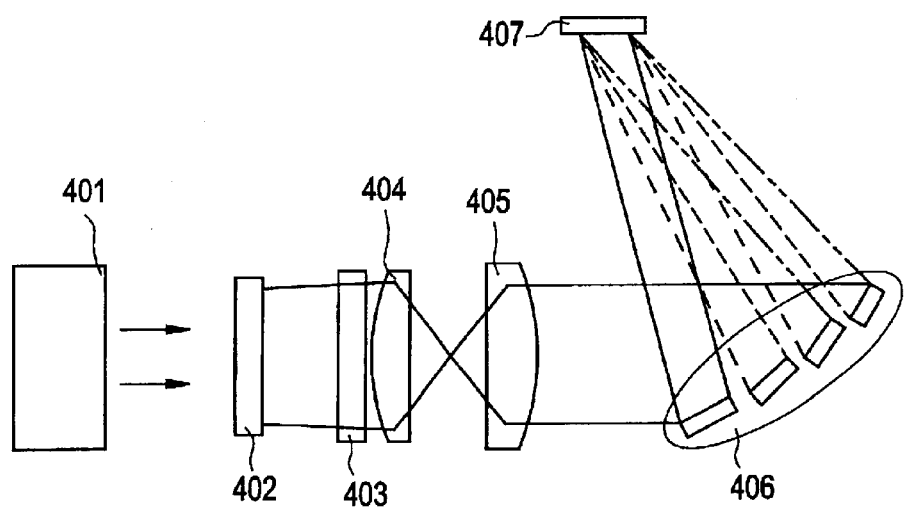
FIG. 4 is a diagram showing an example of a laser irradiation apparatus disclosed in the present invention.
Figure 4B:
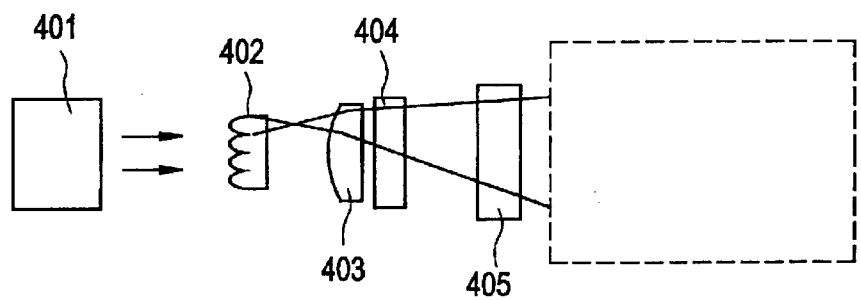

An example of an optical system of the present invention is shown in FIG. 3. First, a side view of FIG. 3 will be described. A laser beam emitted from a laser oscillator 301 travels with a divergent angle. The laser beam is made a parallel light by a cylindrical lens 304 and a cylindrical lens 305, and is converged by a mirror 306 on an irradiation surface 307 of an object, which is held by a stage not shown in the figure. The stage is moved in a direction perpendicular to the longitudinal direction of the laser beam as shown by the arrow 308 in order to treat an entire surface of the object. The cylindrical lens 304 and the cylindrical lens 305 will be described later. The mirror 306 is constructed by a plurality of plane mirrors 306a to 306d. Here, the number of the plane mirrors is made four. The energy of the linear beam in the width direction is made uniform by the mirror 306, and the length is determined. In the mirror 306, the position of the plane mirror 306b is determined by determining the position of the plane mirror 306a, and by this, the position of the plane mirror 306c is determined, and by this, the position of the plane mirror 306d is determined. A method of determining the positions of these plane mirrors will be described later. In the mirror 306, the adjacent plane mirror 306a and the plane mirror 306b, the plane mirror 306b and the plane mirror 306c, the plane mirror 306c and the plane mirror 306d are respectively in contact with each other at end points. However, as shown in FIG. 4, it is not always necessary that the adjacent mirrors are in contact with each other at the ends of the mirrors. A method of determining the arrangement of the respective mirrors in this case will also be described later.

In the meantime, the drawings of the optical system are depicted in such a manner that the laser beam is directed from a lower portion of the drawing sheet to an upper portion of the drawing sheet for the convenience of explanation. However, this relation, i.e. the relation between the mirror and the object to be irradiated with the laser beam can be modified.

As the laser oscillator 301, since an excimer laser has a large output and can oscillate a high repetition pulse of about 300 Hz under the present circumstances, it is often used for crystallization of a semiconductor film. In recent years, in the fabrication of a liquid crystal display of a low temperature polysilicon TFT which has been developed into a product, the excimer laser is used in a crystallizing step of a semiconductor film. Besides, not only the excimer laser, but also an Ar laser, YAG laser, $YVO_4$ laser, or the like can be used.

The function of the cylindrical lens 304 and the cylindrical lens 305 for transforming the laser beam emitted from the laser oscillator 301 into the parallel light will be described. In general, a laser beam has a divergent angle. The divergent angle of the laser beam is different among the respective laser oscillators. For example, in the case of the excimer laser, an exchange of a tube in a laser oscillator must be made once every 1 to 3 years, and further, a resonant mirror at both ends of the tube must be exchanged or polished once every several months to one year. By these operations, even in the same apparatus, the divergent angle of the laser beam is changed by 0.1 to 0.5 mrad. Also in another laser oscillator, a resonant mirror must be exchanged or polished once every several months to one year, and by these operations, the divergent angle is changed. Since the invention disclosed in this specification is apt to receive the influence of the change of the divergent angle, it is necessary to control this, and it becomes indispensable to provide an optical system for forming a parallel beam which does not receive the influence of the change of the divergent angle. The optical system is called a beam collimator.

Figure 5A:
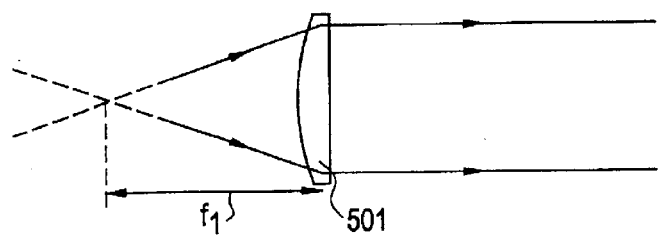
FIGS. 5A–5D are diagrams showing an example of a beam collimator.
Figure 5B:
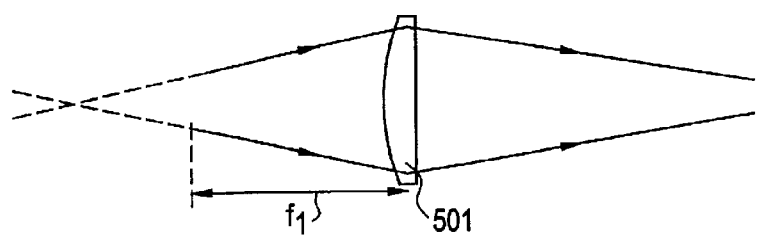

The beam collimator will be described. FIG. 5A shows one lens 501 having a focal distance f1, and a traveling laser beam with a divergent angle becomes a parallel light through the lens 501. When the laser beam is traced in the direction opposite to the traveling direction, it is converged on a point apart from the lens 501 by the focal distance f1. Although FIG. 5B shows one lens 501 having the same focal distance f1 as FIG. 5A, a divergent angle of a laser beam incident on the lens 501 is different from that of FIG. 5A. Even if the laser beam is traced in the direction opposite to the traveling direction, it is not converged on a point apart from the lens 501 by the focal distance f1. Like this, the beam collimator formed of one lens can not cope with the change of the divergent angle of the laser beam by the same lens, and a new lens must be prepared each time the divergent angle is changed, so that the cost is high.

Figure 5C:
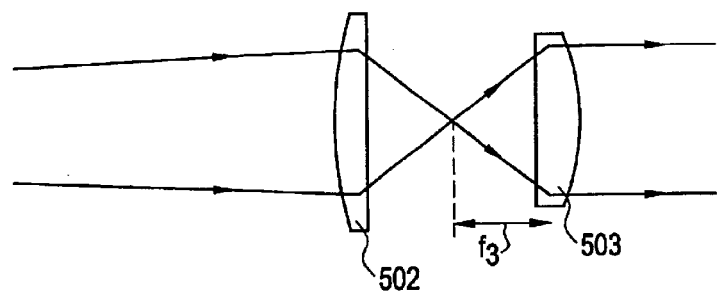
Figure 5D:
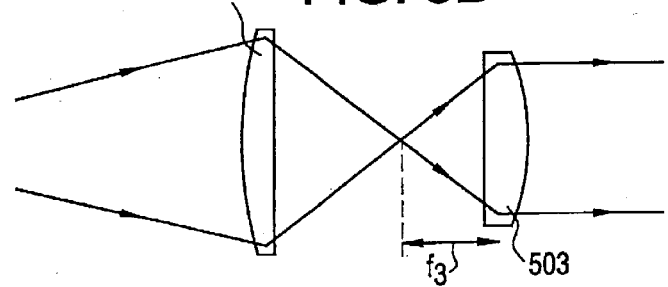

FIG. 5C shows a lens 502 and a lens 503, a traveling laser beam with a divergent angle is once converged after passing through the lens 502, and the lens 503 is disposed apart from the converged point by a focal distance f3. In the case where such arrangement is made, a laser beam having a divergent angle and incident on the lens 502 is once converged, and then, it becomes a parallel light through the lens 503. Although FIG. 5D uses the same lenses 502 and 503 as those of FIG. 5C, a divergent angle of an incident laser beam is different from that of FIG. 5C. However, if the distance between the lens 502 and the lens 503 is changed without changing the fact that the distance from the point on which the laser beam is converged after passing through the lens 502 to the lens 503 is the focal distance f3 of the lens 503, the laser beam passing through the lens 502 and the lens 503 becomes a parallel light.

As described above, although the beam collimator of one lens can cope with only one divergent angle, if it is constructed by two lenses, it can cope with any divergent angles. Thus, also in the case of FIG. 3, it is assumed that the divergent angle of the laser beam is changed, and two lenses of the cylindrical lens 304 and the cylindrical lens 305 are used for transforming a laser beam having a divergent angle into a parallel light.

Next, a top view of FIG. 3 will be described. The laser beam emitted from the laser oscillator 301 is divided toward a direction perpendicular to the traveling direction of the laser beam by a cylindrical array lens 302. The foregoing direction is called a lateral direction in this specification. It is assumed that when a mirror is inserted in the middle of an optical system, the lateral direction turns to the direction of a light bent by the mirror. This structure adopts division into four parts. These divided laser beams are united to make one beam at the irradiation surface 307 by a cylindrical lens 303.

Figure 6:
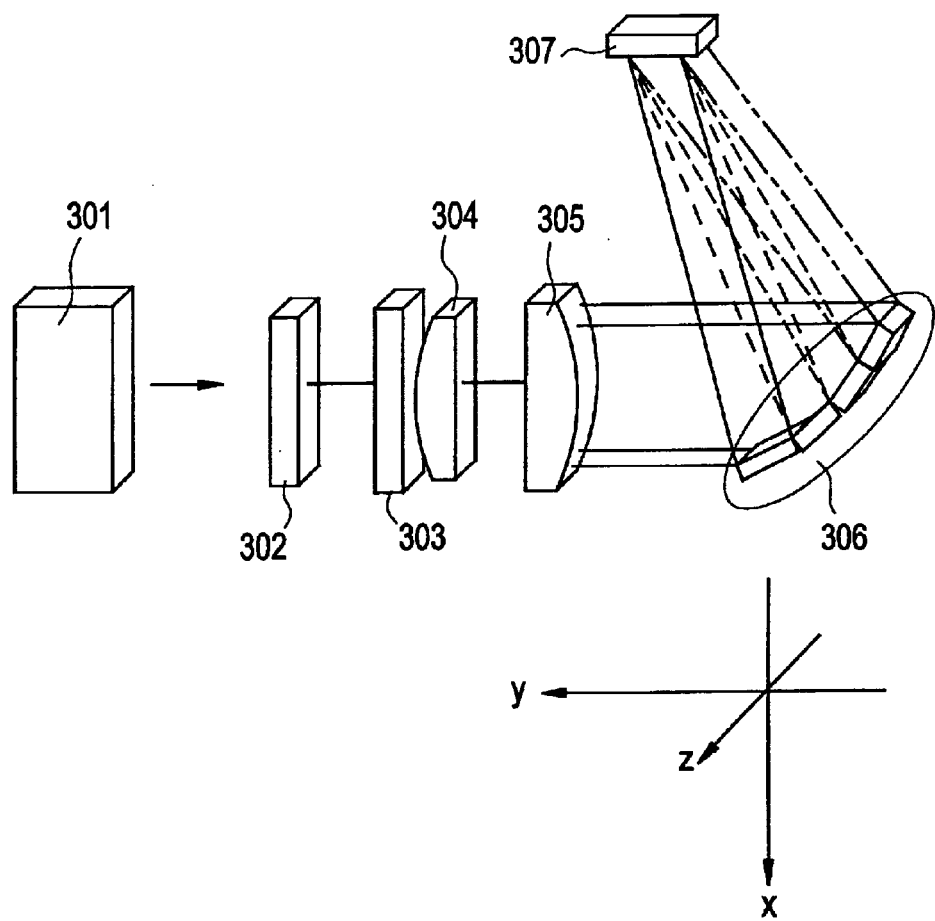
FIG. 6 is a diagram showing an example of a laser irradiation apparatus disclosed in the present invention.

Here, a method of determining the shape of the mirror 306 will be described. As shown in FIG. 6, a plane perpendicular to the irradiation surface and parallel to the width direction of the laser beam is made an xy plane, and the longitudinal direction of the laser beam is made a Z axis. Since FIG. 6 shows FIG. 3 three-dimensionally, reference numerals in the drawing are the same as those of FIG. 3.

Figure 7:
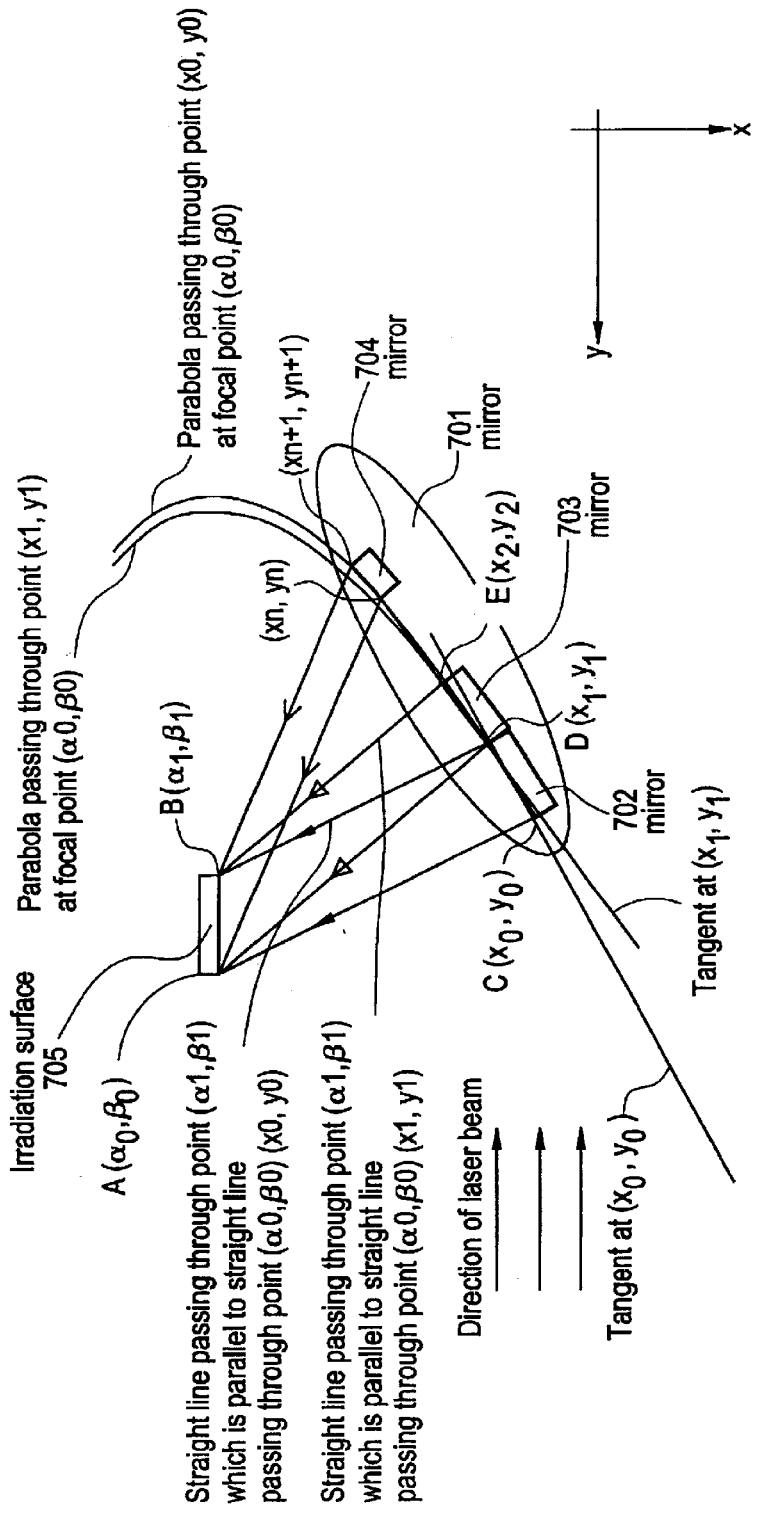
FIG. 7 is a diagram showing an example of displacement of a mirror disclosed in the present invention.

As shown in FIG. 7, a mirror 701 is constituted by a plurality of plane mirrors 702 to 704, and an explanation will be made on a method of determining the positions of the plane mirrors in the case where adjacent mirrors are in contact with each other in the respective mirrors, like the plane mirror 702 and the plane mirror 703. In FIG. 7, similarly to FIG. 6, a plane perpendicular to an irradiation surface and parallel to the width direction of a laser beam is made an xy plane, and the longitudinal direction of the laser beam is made a z axis. Here, for simplifying the explanation of the mirror 701, it is assumed that the mirror 701 and an irradiation surface 705 are disposed at z=0.

Coordinates $A(\alpha\ 0, \beta\ 0)$ and $B(\alpha\ 1, \beta\ 1)$ of both ends of the irradiation surface 705 in the width direction of the laser beam and an arbitrary point $C(x_0, y_0)$ are determined, and an attempt is made to obtain a parabola having the end point $A(\alpha\ 0, \beta\ 0)$ of the irradiation surface as the focal point and passing through the arbitrary point $C(x_0, y_0)$. In general, an equation of a parabola is expressed by $$y=p(x-a)^2+b \qquad \text{[numerical expression 1]}$$

and the coordinate of the focal point is $$(a, b+\tfrac{1}{4}p). \qquad \text{[numerical expression 2]}$$

Thus, in order to obtain the equation of the parabola having the point $A(\alpha\ 0, \beta\ 0)$ as the focal point and passing through the arbitrary point $C(x_0, y_0)$, from the expressions (1) and (2), $$y_0=p(x_0-a)^2+b \qquad \text{[numerical expression 3]}$$

$$a=\alpha_0,\ b+\tfrac{1}{4}p=\beta_0 \qquad \text{[numerical expression 4]}$$

are obtained. When the expressions (3) and (4) are solved,

[numerical expression 5]

$$p = -\frac{1}{2\left(y_0 - \beta_0 \pm \sqrt{(x_0-\alpha_0)^2 + (y_0-\beta_0)^2}\right)}$$

is obtained. Here, $$x_{o \ldots n} > \alpha_0 \text{(n is an integral number)} \qquad \text{[numerical expression 6]}$$

This is a condition under which an obtained mirror does not position at the rear side of the irradiation surface. Although the expression (5) has two solutions, here,

[numerical expression 7] (expression 5')

$$p = -\frac{1}{2\left(y_0 - \beta_0 + \sqrt{(x_0-\alpha_0)^2 + (y_0-\beta_0)^2}\right)}$$

is adopted. The expression (5)' is adopted so as to dispose the mirror 701 at the position where it does not block off the laser beam in FIG. 6.

Next, an attempt is made to obtain an intersection point $D(x_1, y_1)$ between a straight line, which is parallel to a straight line passing through the end point $A(\alpha_0, \beta_0)$ and the arbitrary point $C(x_0, y_0)$ and passes through the end point $B(\alpha_1, \beta_1)$ of the irradiation surface, and a tangent of the parabola at the arbitrary point $C(x_0, y_0)$.

Since a slope y' of the tangent of the parabola at the arbitrary point $C(x_0, y_0)$ is $$y'=2p(x_0-\alpha_0) \qquad \text{[numerical expression 8]}$$

the equation of the tangent of the parabola at the arbitrary point $C(x_0, y_0)$ becomes $$y=2p(x_0-\alpha_0)(x-x_0)+y_0 \qquad \text{[numerical expression 9]}$$

The slope of the straight line passing through the end point $A(\alpha\ 0, \beta\ 0)$ of the irradiation surface and the arbitrary pint $C(x_0, y_0)$ is $$(y_0-\beta_0)/(x_0-\alpha_0), \qquad \text{[numerical expression 10]}$$

the equation of the straight line parallel to the straight line passing through the end point $A(\alpha\ 0, \beta\ 0)$ of the irradiation surface and the arbitrary point $C(x_0, y_0)$ and passing through the end point $B(\alpha\ 1, \beta\ 1)$ of the irradiation surface is $$y=[(y_0-\beta_0)/(x_0-\alpha_0)](x-\alpha_1)+\beta_1. \qquad \text{[numerical expression 11]}$$

When the expressions (7) and (9) are solved to obtain the intersection point,

[numerical expression 12]

$$x = -\frac{2px_0(x_0-\alpha_0)^2 - (x_0-\alpha_0)(y_0-\beta_1) - \alpha_1(y_0-\beta_1)}{2p(x_0-\alpha_0)^2 - (y_0-\beta_1)}$$

[numerical expression 13]

$$y = -\frac{2p(x_0-\alpha_0)^2\alpha_1 - (y_0-\beta_1)\{y_0 - 2p(x_0-\alpha_0)(x_0-\alpha_1)\}}{2p(x_0-\alpha_0)^2 - (y_0-\beta_1)}$$

and the point $D(x_1, y_1)$ is obtained. That is, when the coordinate $A(\alpha\ 0, \beta\ 0)$ and $B(\alpha\ 1, \beta\ 1)$ of both ends in the width direction of the laser beam and the arbitrary point $C(x_0, y_0)$ are determined, and the coefficient p of the parabola passing through the arbitrary point $C(x_0, y_0)$ is obtained using the expression (5)', the point $D(x_1, y_1)$ is determined by the expressions (10) and (11). If the mirror is disposed on a line segment connecting the arbitrary point $C(x_0, y_0)$ and the point $D(x_1, y_1)$, all lights reflected by this mirror are converged on the irradiation surface.

Next, an attempt is made to obtain a parabola having the end point $A(\alpha\ 0, \beta\ 0)$ of the irradiation surface as the focal point and passing through the obtained point $D(x_1, y_1)$, and an attempt is made to obtain an intersection point $E(x2, y2)$ between a tangent of the parabola at the point $D(x_1, y_1)$ and a straight line which passes through the end point $B(\alpha_1, \beta_1)$ of the irradiation surface and is parallel to a line passing through the point $A(\alpha_0, \beta_0)$ and the point $D(x_1, y_1)$. If a mirror is disposed on a line segment connecting the point $D(x_1, y_1)$ and the point $E(x2, y2)$, all lights reflected by this mirror are converged on the irradiation surface.

As described above, if the coordinates of the irradiation surface and one arbitrary point are first determined, the positions of the mirrors can be sequentially determined using the expressions (5)', (10) and (11).

Figure 8:
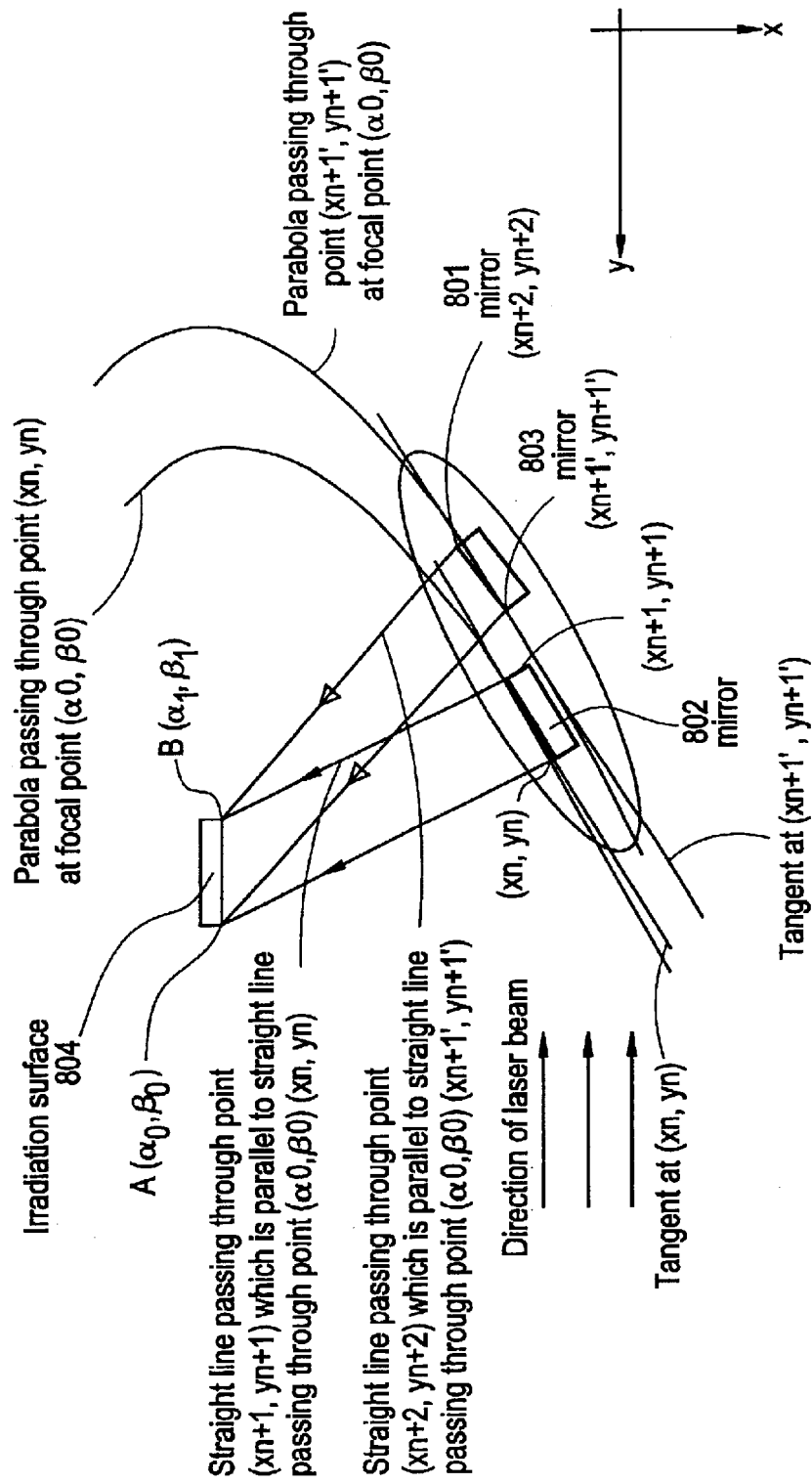
FIG. 8 is a diagram showing an example of displacement of a mirror disclosed in the present invention.

Although the description has been made on the case where adjacent plane mirrors such as the plane mirror 702 and the plane mirror 703 are in contact with each other at the ends of the mirrors, a case where they are not in contact with other, as shown in FIG. 4, will be described. For the description of a mirror 406 of FIG. 4, FIG. 8 is used. In FIG. 8, similarly to FIG. 7, a plane perpendicular to an irradiation surface and parallel to the width direction of a beam is made an xy plane, and the longitudinal direction of the beam is made a z axis. Here, for simplifying the explanation of a mirror 801, it is assumed that the mirror 801 and an irradiation surface 805 are disposed at z=0.

When n is an arbitrary positive integer, and an optical path difference from each of coordinates (xn, yn) and (xn+1, yn+1) of both ends of an n-th mirror to an end point $A(\alpha_0, \beta_0)$ of the irradiation surface is not sufficient, a numerical value in view of a coherent length depending on the kind of a laser oscillator is subtracted from the y coordinate of (xn+1, yn+1), and a newly obtained coordinate is made (xn+1', yn+1'). By the use of the coordinate (xn+1', yn+1') and the coordinates $A(\alpha\ \mathbf{0}, \beta\ \mathbf{0})$ and $B(\alpha\ \mathbf{1}, \beta\ \mathbf{1})$ of both ends of the irradiation surface, (xn+2, yn+2) is obtained from the expressions (5)', (10) and (11), and when a plane mirror is disposed on a line segment connecting (xn+1', yn+1') and (xn+2, yn+2), a sufficient optical path difference is obtained and a mirror 703 by which a light is converged on the same position of the irradiation surface 704 is obtained.

Figure 9A:
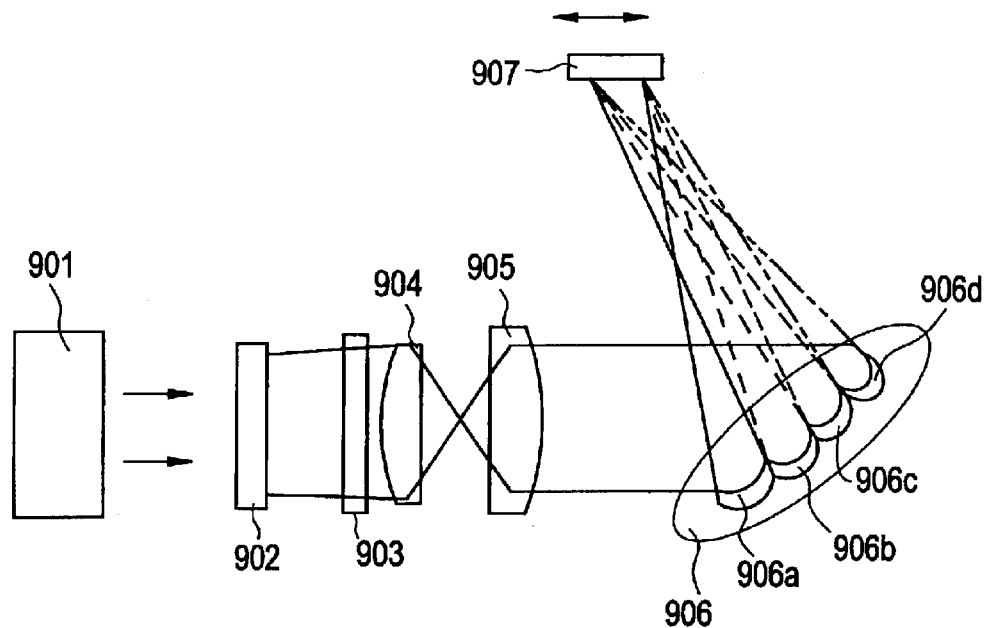
FIG. 9 is a diagram showing an example of a laser irradiation apparatus disclosed in the present invention.
Figure 9B:
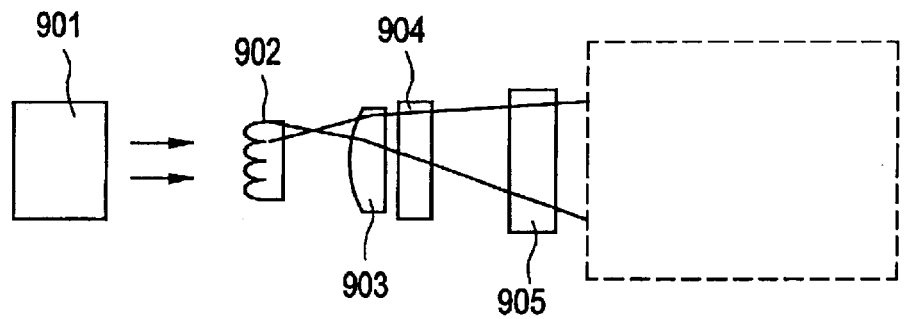

Next, an example of an optical system using a mirror 906 made of a plurality of mirrors each having a paraboloid, instead of the mirror 306 of FIG. 3, is shown in FIG. 9. First, a description wilt be made with reference to a side view of FIG. 9. A laser beam emitted from a laser oscillator 901 travels straight with a divergent angle, is made a parallel light by a cylindrical lens 904 and a cylindrical lens 905, and is converged on an irradiation surface 907 by the mirror 906. The principle in which the laser beam having a divergent angle becomes the parallel light by the cylindrical lens 904 and the cylindrical lens 905 is the same as the case of FIG. 3. The shape of the mirror 906 is made of a collection of paraboloid mirrors with different curvatures, and a light is once converged on the focal point, and then, it reaches the irradiation surface. Here, the number of the paraboloid mirrors is made four. Since the respective paraboloids have different curvatures, the focal points are also different from one another. By these paraboloid mirrors 906a to 906d, the energy of a linear beam in the width direction is made uniform, and the length is determined. In adjacent mirrors such as a paraboloid mirror 906a and a paraboloid mirror 906b, although an end of the mirror may be in contact with the next mirror, it may not be in contact with the next mirror, like a mirror 1006 of FIG. 10. The arrangement of the mirror 1006 of FIG. 10 will be explained later.

Next, a description will be made with reference to a top view of FIG. 9. The laser beam emitted from the laser oscillator 901 is divided toward a direction perpendicular to a traveling direction of the laser beam by a cylindrical array lens 902. The foregoing direction is called a lateral direction in this specification. It is assumed that when a mirror is inserted in the middle of an optical system, the lateral direction turns to the direction of a light bent by the mirror. This structure adopts division into four parts. These divided laser beams are united to make one beam at the irradiation surface 907 by a cylindrical lens 903.

Figure 10A:
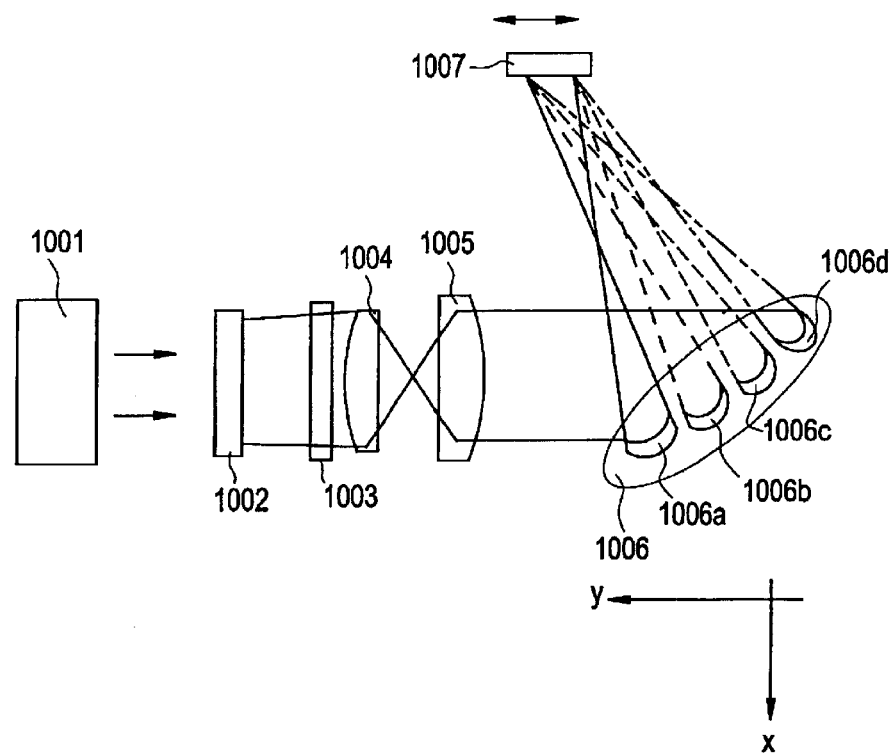
FIG. 10 is a diagram showing an example of a laser irradiation apparatus disclosed in the present invention.
Figure 10B:
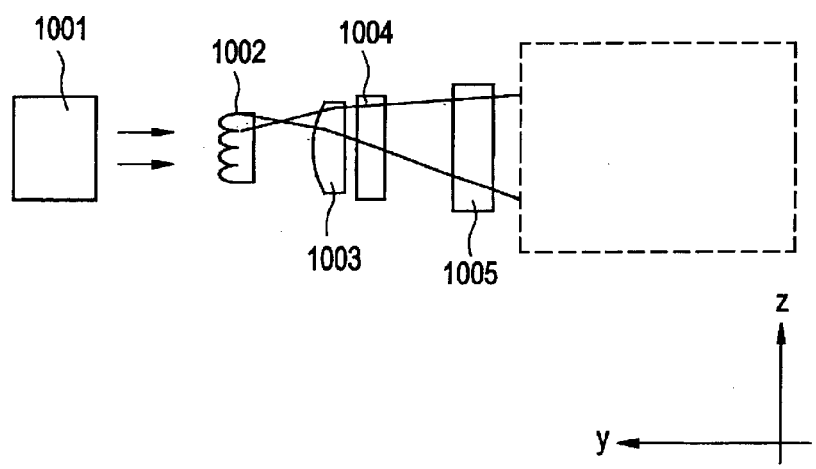

Here, the arrangement of the mirror 1006 of FIG. 10 will be described. In FIG. 10, a plane perpendicular to an irradiation surface and parallel to the width direction of a beam is made an xy plane, and the longitudinal direction of the laser beam is made a z axis. A method of determining the arrangement of the mirror 1006 will be described. The position of a paraboloid mirror 1006a is on a line segment connecting an arbitrary point and a point obtained from the arbitrary point and coordinates of both ends in the width direction of the laser beam on an irradiation surface 1007. A numerical value in view of a coherent length of the laser beam is subtracted from the y coordinate of the obtained point to obtain a new coordinate. The position of a paraboloid mirror 1006b is on a line segment connecting the coordinate and a point obtained from coordinates of both ends in the width direction of the beam on the irradiation surface 1007. When a paraboloid mirror 1006c and a paraboloid mirror 1006d are obtained in such a method, it is possible to obtain the mirror 1006 in which adjacent mirrors are not in contact with each other and a sufficient optical path difference to the irradiation surface is obtained.

Embodiment 1

In this embodiment, a case where irradiation is made using an excimer laser will be described. The basic structure of a laser irradiation apparatus of this embodiment is the same as FIG. 3, and the positions of respective mirrors in a mirror of the invention are concretely calculated and are shown in FIG. 11. In FIG. 11, a plane perpendicular to an irradiation surface and parallel to the width direction of a beam is made an xy plane, and the longitudinal direction of the beam is made a z axis. Here, for simplifying the explanation of a mirror 1101, it is assumed that the mirror 1101 and an irradiation surface 1105 are disposed at z=0.

The mirror 1101 is made of a plurality of plane mirrors 1102 to 1104. The plane perpendicular to the irradiation surface and parallel to the width direction of the beam is made the xy plane, and the longitudinal direction of the beam is made the z axis. Here, for simplifying the explanation of the mirror 1101, it is assumed that the mirror 1101 and the irradiation surface 1105 are disposed at z=0.

Coordinates of both ends in the width direction of the beam on the irradiation surface 1105 are made (0, 200) and (0, 199). In this specification, it is assumed that 1 in the coordinate corresponds to 1 mm. Since it is desired that the width of the laser beam obtained at the irradiation surface 1005 is made about 1 mm, the coordinates are made those as described before. An arbitrary point is made $(x_0, y_0)$= (200, 190), and when the end point (0, 200) of the irradiation surface is regarded as a focal point and an attempt is made to obtain a coefficient p of a parabola passing through the point (200, 190), from the expression (5)', p=0.00237812 is obtained. Thus, when an attempt is made to obtain $(x_1, y_1)$ by using the expressions (10) and (11), $(x_1, y_1)$=(199.001, 189.050).

The obtained $(x_1, y_1)$ is regarded as a new arbitrary point, and when an attempt is made to obtain a coefficient of a parabola passing through this point, p=0.00237809 is obtained. Thus, when an attempt is made to obtain (x2, y2) by using the expressions (10) and (11), (x2, y2)=(198.003, 188.105).

When an attempt is made to obtain (x3, y3) in a similar method, (x3, y3)=(197.005, 187.165).

An optical path difference from each of ($x_0$, $y_0$) and ($x_1$, $y_1$) to the end point (0, 200) in the width direction of the beam on the irradiation surface 1105 is

[numerical expression 14]
$$y_0 - y_1 + \sqrt{(\alpha_0 - x_0)^2 + (\beta_0 - y_0)^2} -$$
$$\sqrt{(\alpha_0 - x_1)^2 + (\beta_0 - y_1)^2} = 190 -$$
$$189.050 + \sqrt{(0-200)^2 + (200-190)^2} -$$
$$\sqrt{(0-199.001)^2 + (200-189.050)^2} =$$
$$1.89762$$

an optical path difference from each of ($x_1$, $y_1$) and (x2, y2) to the end point (0, 200) in the width direction of the beam on the irradiation surface 1105 is

[numerical expression 15]
$$y_1 - y_2 + \sqrt{(\alpha_0 - x_1)^2 + (\beta_0 - y_1)^2} -$$
$$\sqrt{(\alpha_0 - x_2)^2 + (\beta_0 - y_2)^2} =$$
$$189.050 - 188.105 +$$
$$\sqrt{(0-199.001)^2 + (200-189.050)^2} -$$
$$\sqrt{(0-198.003)^2 + (200-188.105)^2} =$$
$$1.88760$$

and an optical path difference from each of (x2, y2) and (x3, y3) to the end point (0, 200) in the width direction of the beam on the irradiation surface 1105 is

[numerical expression 16]
$$y_2 - y_3 + \sqrt{(\alpha_0 - x_2)^2 + (\beta_0 - y_2)^2} -$$
$$\sqrt{(\alpha_0 - x_{31})^2 + (\beta_0 - y_{31})^2} =$$
$$188.105 - 187.165 +$$
$$\sqrt{(0-198.003)^2 + (200-188.105)^2} -$$
$$\sqrt{(0-197.005)^2 + (200-187.165)^2} =$$
$$1.87754$$

Since the coherent length of the excimer laser is about several μm to several tens of μm and the unit of the optical difference is mm, it is longer than the coherent length and the interference does not occur. However, in order to lengthen the light path length and to enlarge the optical path difference, when the first coordinate ($x_1$, $y_1$) is determined, for example, 1 is subtracted from the y coordinate to obtain a new coordinate ($x_1'$, $y_1'$), and when an attempt is made to obtain a coordinate of the other end of the mirror based on this coordinate, a mirror by which the interference is further suppressed can be fabricated.

Figure 12:
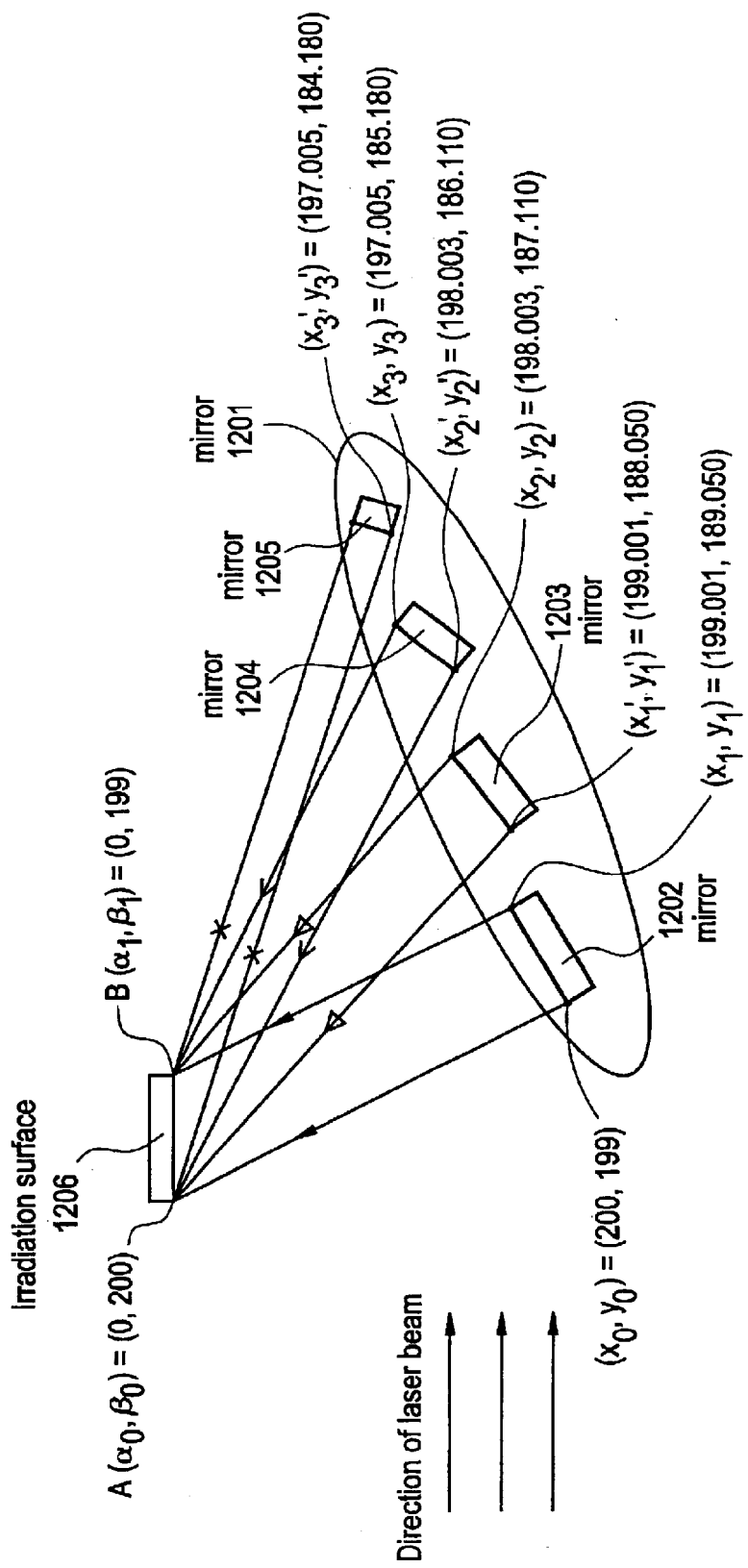
FIG. 12 is a diagram showing an example of displacement of a mirror disclosed in the present invention.

A method of fabricating the mirror will be described with reference to FIG. 12. In FIG. 12, similarly to FIG. 11, a plane perpendicular to an irradiation surface and parallel to the width direction of a laser beam is made an xy plane, and the longitudinal direction of the beam is made a z axis. Here, for simplifying the explanation of a mirror 1201, it is assumed that the mirror 1201 and an irradiation surface 1206 are disposed at Z=0.

When coordinates of both ends in the width direction of the laser beam are made (0, 200) and (0,199), and the arbitrary point is made ($x_0$, $y_0$)=(200, 190), although ($x_1$, $y_1$)=(199.001, 189.050) is obtained as already described, 1 is subtracted from the y coordinate to obtain ($x_1'$, $y_1'$)= (199.001, 188.050). When an attempt is made to obtain (x2, y2) based on this, (x2, y2)=(198.003, 187.110). When 1 is subtracted from the y coordinate, (x2', y2')=(198.003, 186.110) is obtained. When an attempt is made to obtain (x3, y3), (x3, y3)=(197.005, 185.180) is obtained, and the coordinate is shifted by 1 in the x direction to obtain (x3', y3')=(197.005, 184.180).

On the basis of the coordinates obtained in the manner as described above, an attempt is made to obtain the optical path difference to the end point (0, 200) of the irradiation surface 1206 in the width direction of the laser beam. The optical path difference between ($x_0$, $y_0$) and ($x_1'$, $y_1'$) becomes 2.84018, the optical path difference between ($x_1'$, $y_1'$) and (x2', y2') becomes 2.81013, and the optical path difference between (x2', y2') and (x3', y3') becomes 2.77999. The optical path difference becomes larger than that of the arrangement where the adjacent mirrors are in contact with each other at the end points, and the interference can be further suppressed.

Embodiment 2

In this embodiment, a description will be made on a case where irradiation is made using a YAG laser. Although the basic structure of a laser irradiation apparatus of this embodiment is the same as FIG. 9, positions of mirrors are concretely calculated.

Figure 13:
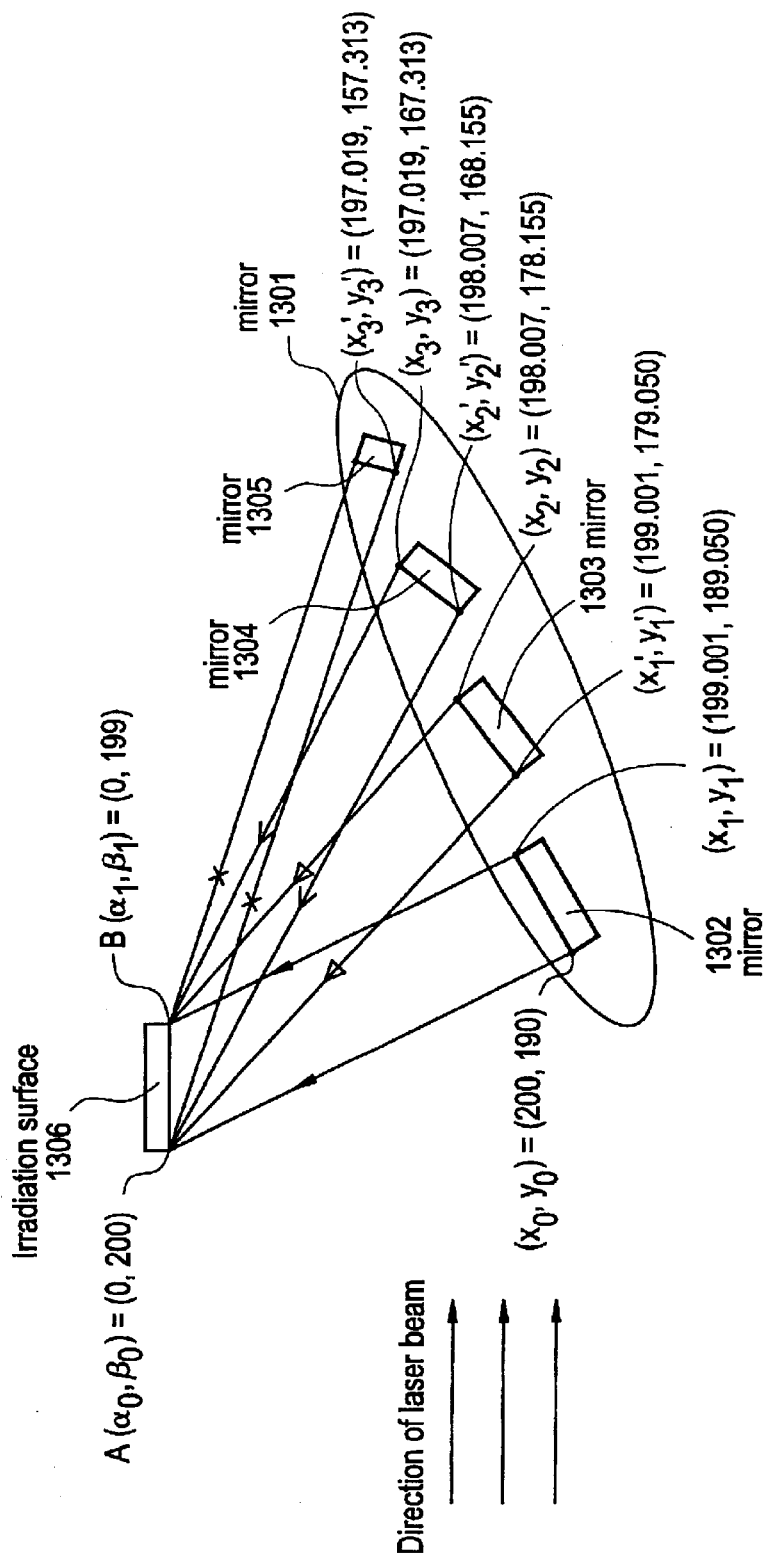
FIG. 13 is a diagram showing an example of displacement of a mirror disclosed in the present invention.

Since the coherent length of the YAG laser is longer than the coherent length of the excimer laser, the interference can not be suppressed very much by only shifting a mirror by 1 mm as in FIG. 12 of Embodiment 1. Thus, it is better to shift a mirror by about 10 mm as in FIG. 13.

Similarly to Embodiment 1, coordinates of both ends in the width direction of a laser beam on an irradiation surface 1306 are made (0, 200) and (0, 199). Since it is desired that an actual laser beam width is made about 1 mm, the coordinate is also made such. An arbitrary point is made ($x_0$, $y_0$)=(200, 190), and similarly to Embodiment 1, when an attempt is made to obtain ($x_1$, $y_1$) by using the expressions (10) and (11), ($x_1$, $y_1$)=(199.001, 189.050) is obtained. However, 10 is subtracted from the y coordinate to obtain ($x_1'$, $y_1'$)=(199.001, 179.050). When an attempt is made to obtain (x2, y2) by using this, (x2, y2)=(198.007, 178.155) is obtained, and 10 is subtracted from the y coordinate to obtain (x2', y2')=(198.007, 168.155). When an attempt is made to obtain (x3, y3), by using this (x3, y3)=(197.019, 167.313) is obtained, and 10 is subtracted from the y coordinate to obtain (x3', y3')=(197.019, 157.313).

By using the coordinates obtained in the manner as described above, an attempt is made to obtain the optical path difference to the end point (0, 200) in the width direction of the laser beam on the irradiation surface 1306. The optical path difference between ($x_0$, $y_0$) and ($x_1'$, $y_1'$) becomes 11.0989, the optical path difference between ($x_1'$, $y_1'$) and (x2', becomes 10.4450, and the optical path difference between (x2', y2') and (x3', y3') becomes 9.80177, and it is understood that the interference is suppressed in the mirror.

Embodiment 3

This embodiment will be described with reference to FIGS. 15A to 21. Here, a method of fabricating a pixel TFT of a display region and a TFT of a driver circuit provided at the periphery of the display region on the same substrate, and a display device using the same, will be described in detail in accordance with a fabricating process. However, for simplification of the explanation, a CMOS circuit as a basic circuit of a shift register circuit, a buffer circuit, or the like in a control circuit and an n-channel TFT forming a sampling circuit will be shown in the drawings.

Figure 15A:
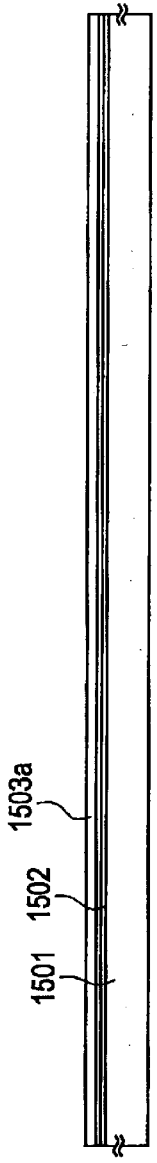
FIGS. 15A to 15D are diagrams showing an example of a manufacturing process of a pixel TFT and a TFT of a driver circuit.

In FIG. 15A, as a substrate 1501, a low alkaline glass substrate or a quartz substrate can be used. In this embodiment, the low alkaline glass substrate was used. An under film 1502, such as a silicon oxide film, a silicon nitride film, or a silicon nitride oxide film, for preventing impurity diffusion from the substrate 1501 is formed on the surface of this substrate 1501 on which the TFTs are to be formed. For example, by a plasma CVD method, a silicon nitride oxide film made of $SiH_4$, $NH_3$ and $N_2O$ and having a thickness of 100 nm, and a silicon nitride oxide film made of $SiH_4$ and $N_2O$ and having a thickness of 200 nm are laminated.

Next, a semiconductor film 1503a having a thickness of 20 to 150 nm (preferably 30 to 80 nm) and an amorphous structure is formed by a well-known method such as plasma CVD or by sputtering. In this embodiment, an amorphous silicon film was formed to a thickness of 55 nm by plasma CVD. As the semiconductor film having the amorphous structure, there is an amorphous semiconductor film or a microcrystalline semiconductor film, and a compound semiconductor film having the amorphous structure, such as an amorphous silicon germanium film, may be applied. Since the under film 1502 and the amorphous silicon film 1503a can be formed by the same film formation method, both may be continuously formed. After the under film is formed, when it is not exposed to the air, pollution of its surface can be prevented, and it is possible to decrease fluctuation in characteristics of a fabricated TFT and variation in threshold voltage (FIG. 15A).

Figure 15B:
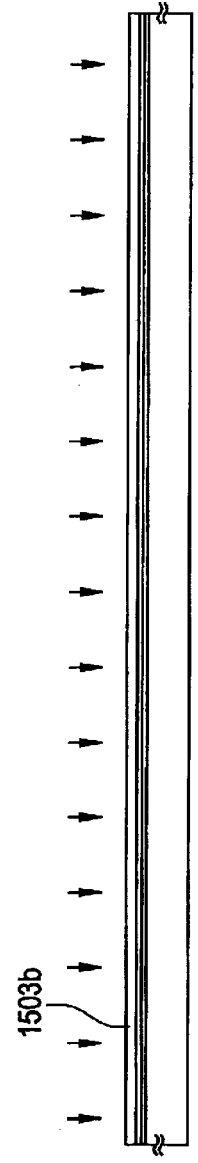

A crystalline silicon film 1503b is formed from the amorphous silicon film 1503a by using a crystallizing technique. In this embodiment, the laser apparatus of the present invention was used, and laser crystallization was carried out in accordance with Embodiment 1. Prior to the step of crystallization, although depending on the hydrogen content of the amorphous silicon film, it is desirable that a heat treatment at 400 to 500° C. for about 1 hour is carried out to make the hydrogen content 5 atom % or less, and then, crystallization is made (FIG. 15B).

Figure 15C:
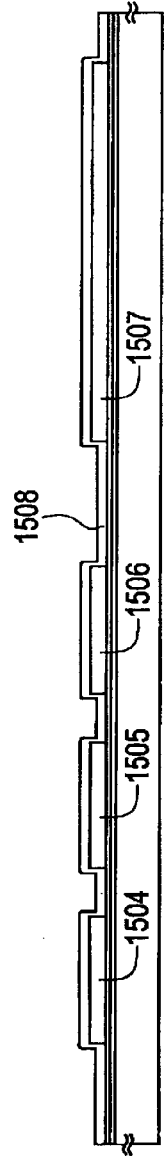

The crystalline silicon film 1503b is divided into islands to form island-like semiconductor layers 1504 to 1507. Thereafter, a mask layer 1508 having a thickness of 50 to 100 nm and made of a silicon oxide film is formed by plasma CVD or by sputtering (FIG. 15C).

Then a resist mask 1509 is provided, and for the purpose of controlling the threshold voltage, boron (B) as an impurity element to give a p type is added at a concentration of about $1\times10^{16}$ to $5\times10^{17}$ atoms/cm$^3$ to all the surfaces of the island-like semiconductor layers 1505 to 1507 forming n-channel TFTs. Addition of boron (B) may be carried out by ion doping or may be made at the same time as the film formation of the amorphous silicon film. Although the addition of boron (B) here is not always necessary, it is preferable to form the semiconductor layers 1510 to 1512 added with boron in order to restrict the threshold voltages of the n-channel TFTs in a predetermined range (FIG. 15D).

For the purpose of forming an LDD region of the n-channel TFT of the driver circuit, an impurity element to give an n type is selectively added to the island-like semiconductor layers 1510 and 1511. For that purpose, resist masks 1513 to 1516 are formed in advance. As the impurity element to give the n type, phosphorus (P) or arsenic (As) may be used, and here, ion doping using phosphine ($PH_3$) was applied to add phosphorus (P). It is appropriate that the concentration of phosphorous (P) of formed impurity regions 1517 and 1518 is made to be in the range of $2\times10^{16}$ to $5\times10^{19}$ atoms/cm$^3$. In this specification, the concentration of the impurity element to give the n type contained in the impurity regions 1517 to 1519 formed here is designated by (n$^-$). The impurity region 1519 is a semiconductor layer for forming a holding capacitance of a pixel matrix circuit, and phosphorus (P) at the same concentration was also added to this region (FIG. 16A).

Figure 15D:
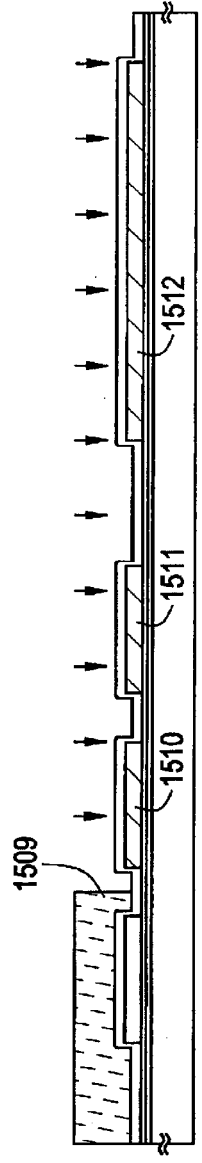

Next, the mask layer 1508 is removed by hydrofluoric acid or the like, and a step of activating the impurity elements added in FIG. 15D and FIG. 16A is carried out. The activation can be carried out by a heat treatment in a nitrogen atmosphere at 500 to 600° C. for 1 to 4 hours, or a laser activation method. Besides, both may be carried out together. Besides, the laser irradiation in accordance with the present invention, for example, Embodiment 1 may be carried out. In this embodiment, a method of laser activation was used, a KrF excimer laser (wavelength 248 nm) was used, a linear beam was formed, an oscillation frequency of 5 to 50 Hz and an energy density of 100 to 500 mJ/cm$^2$ were prepared, and scanning was made while an overlap ratio of the linear beam was made 80 to 98%, so that the whole surface of the substrate on which the island-like semiconductor layers were formed was treated. Incidentally, any irradiation conditions of the laser beam are not limited, and an operator may suitably determine them.

A gate insulating film 1520 is formed of an insulating film having a thickness of 10 to 150 nm and containing silicon by using plasma CVD or by sputtering. For example, a silicon nitride oxide film is formed to a thickness of 120 nm. As the gate insulating film, a single layer or a laminate structure of another insulating film containing silicon may be used (FIG. 16B).

Next, a first conductive layer is formed to form a gate electrode. Although this first conductive layer may be formed of a single layer, a laminate structure such as two layers or three layers may be adopted as the need arises. In this embodiment, a conductive layer (A) 1521 made of a conductive nitride metal film and a conductive layer (B) 1522 made of a metal film were laminated. The conductive layer (B) 1522 may be formed of an element selected from tantalum (Ta), titanium (Ti), molybdenum (Mo) and tungsten (W), an alloy containing the foregoing elements as its main constituents, or an alloy film of a combination of the foregoing elements (typically, Mo—W alloy film, Mo—Ta alloy film). The conductive layer (A) 1521 is formed of tantalum nitride (TaN), tungsten nitride (WN), titanium nitride (TiN), or molybdenum nitride (MoN). For the conductive layer (A) 1521, as an alternative material, tungsten silicide, titanium silicide, or molybdenum silicide may be applied. In the conductive layer (B), in order to decrease the resistance, it is appropriate that the concentration of a contained impurity is decreased, and particularly with respect to the oxygen concentration, it was appropriate that the concentration was made 30 ppm or less. For example, with respect to tungsten (W), when the oxygen concentration was made 30 ppm or less, it was possible to realize a specific resistance value of 20 $\mu\Omega$cm or less.

It is appropriate that the thickness of the conductive layer (A) is made 10 to 50 nm (preferably 20 to 30 nm) and that of the conductive layer (B) 1522 is made 200 to 400 nm (preferably 250 to 350 nm). In this embodiment, a tantalum nitride having a thickness of 30 nm was used for the conductive layer (A) 1521, a Ta film having a thickness of 350 nm was used for the conductive layer (B), and both were formed by sputtering. In this film formation by this sputtering, when a suitable amount of Xe or Kr is added to Ar of a gas for sputtering, it is possible to relieve the internal stress of the formed film and to prevent the peeling of the film. Incidentally, although not shown, it is effective to form a silicon film having a thickness of about 2 to 20 nm and doped with phosphorus under the conductive layer (A) 1521. By this, the improvement of adhesion of the conductive film formed thereon and prevention of oxidation are realized, and it is possible to prevent a very small amount of alkaline metal element contained in the conductive layer (A) or the conductive layer (B) from diffusing into the gate insulating film 1520 (FIG. 16C).

Next, resist masks 1523 to 1527 are formed, and the conductive layer (A) 1521 and the conductive layer (B) 1522 are etched at the same time to form gate electrodes 1528 to 1531 and a capacitance wiring line 1532. The gate electrodes 1528 to 1531 and the capacitance wiring line 1532 are formed of films 1528a to 1532a made of the conductive layer (A) and films 1528b to 1532b made of the conductive layer (B) in a body. At this time, the gate electrodes 1529 and 1530 formed in the driver circuit are formed so as to overlap with part of the impurity regions 1517 and 1518 through the gate insulating film 1520 (FIG. 16D).

Figure 17A:
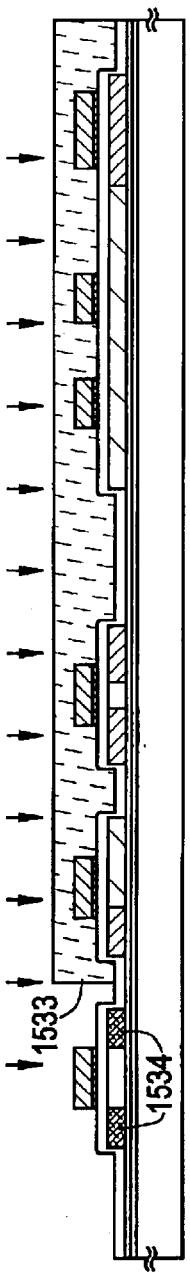
FIGS. 17A to 17D are diagrams showing an example of a manufacturing process of a pixel TFT and a TFT of a driver circuit.

Next, in order to form a source region and a drain region of a p-channel TFT of the driver circuit, a step of adding an impurity element to give a p type is carried out. Here, the gate electrode 1528 is used as a mask, to form an impurity region in a self-aligning manner. At this time, a region where the n-channel TFT is to be formed, is covered with a resist mask 1533. Then an impurity region 1534 is formed by ion doping using diborane ($B_2H_6$). The concentration of boron in this region is made $3\times10^{20}$ to $3\times10^{21}$ atoms/cm$^3$. In this specification, the concentration of the impurity element to give the p type contained in the impurity region 1534 formed here is designated by (p$^-$) (FIG. 17A).

Figure 17B:
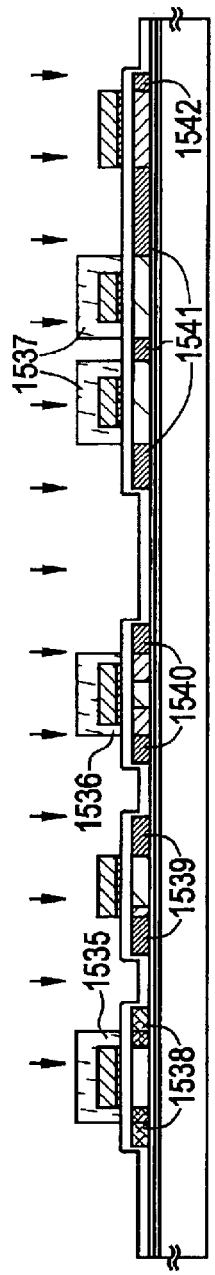

Next, in the n-channel TFT, an impurity region functioning as a source region or a drain region was formed. Resist masks 1535 to 1537 were formed, and an impurity element to give an n type was added to form impurity regions 1538 to 1542. This was carried out by ion doping using phosphine (PH$_3$), and the concentration of phosphorus (P) in this region was made $1\times10^{20}$ to $1\times10^{21}$ atoms/cm$^3$. In this specification, the concentration of the impurity element to give the n type contained in the impurity regions 1538 to 1542 formed here is designated by (n$^-$) (FIG. 17B).

Although phosphorus (P) or boron (B) added in the former step is already contained in the impurity regions 1538 to 1542, since phosphorus (P) is added at a sufficiently high concentration as compared with that, it is not necessary to consider the influence of phosphorus (P) or boron (B) added in the former step. Since the concentration of phosphorus (P) added in the impurity region 1538 was ½ to ⅓ of the concentration of boron (B) added in FIG. 17A, the p-type conductivity was kept and no influence was exerted to the characteristics of the TFT.

Figure 17C:
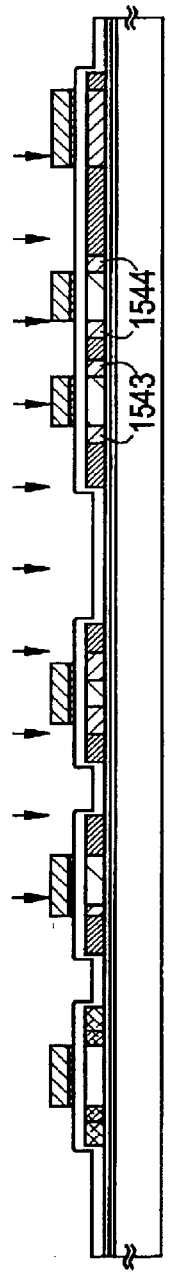

Then a step of adding an impurity element to give an n type for forming an LDD region of the n-channel TFT of the pixel matrix circuit was carried out. Here, the gate electrode 1531 was made a mask, and the impurity element to give the n type was added by ion doping in the self-aligning manner. The concentration of added phosphorus (P) is $1\times10^{16}$ to $5\times10^{18}$ atoms/cm$^3$, and by adding phosphorus at the concentration lower than the concentration of the impurity elements added in FIG. 16A and FIGS. 17A and 17B, only impurity regions 1543 and 1544 are actually formed. In this specification, the concentration of the impurity element to give the n type contained in the impurity regions 1543 and 1544 is designated by (n$^{--}$) (FIG. 17C).

Thereafter, a heat treatment step for activating the impurity elements to give the n type or the p type added at the respective concentrations is carried out. This step can be carried out by a furnace annealing method, a laser annealing method, or a rapid thermal annealing method (RTA). Here, the activation step was carried out by the furnace annealing method. The heat treatment is carried out in a nitrogen atmosphere containing oxygen of a concentration of 1 ppm or less, preferably 0.1 ppm or less, at 400 to 800° C., typically 500 to 600° C. In this embodiment, the heat treatment at 550° C. for 4 hours was carried out. Besides, as the substrate 1501, in the case where one having heat resistance such as a quartz substrate, is used, a heat treatment at 800° C. for 1 hour may be carried out. It was possible to activate the impurity elements and to excellently form contacts between the impurity regions added with the impurity elements and the channel forming regions.

Figure 17D:
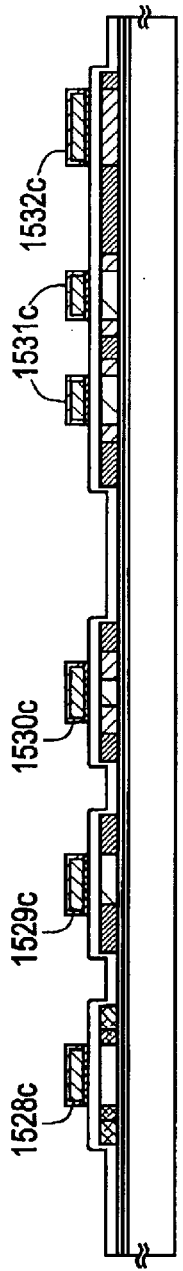

In this heat treatment, in the metal films 1528b to 1532b for forming the gate electrodes 1528 to 1531 and the capacitance wiring line 1532, conductive layers (C) 1528c to 1532c having a thickness of 5 to 80 nm from the surface are formed. For example, in the case where the conductive layers (B) 1528b to 1532b are made of tungsten (W), tungsten nitride (WN) is formed, and in the case of tantalum (Ta), tantalum nitride (TaN) can be formed. Further, the conductive layers (C) 1528c to 1532c can be formed in the same way even when the gate electrodes 1528 to 1531 are exposed to a plasma atmosphere containing nitrogen or nitrogen using ammonia or the like. Further, a step of hydrogenating the island-like semiconductor layers was carried out by performing a heat treatment in an atmosphere containing hydrogen of 3 to 100% at 300 to 450° C. for 1 to 12 hours. This step is a step for terminating dangling bonds of the semiconductor layer by thermally excited hydrogen. As another means for hydrogenation, plasma hydrogenation (using hydrogen excited by plasma) may be carried out (FIG. 17D).

After the steps of activation and hydrogenation are ended, a second conductive film which is made a gate wiring line is formed. It is appropriate that this second conductive film is formed of a conductive layer (D) mainly containing aluminum (Al) or copper (Cu) as a low resistance material, and a conductive layer (E) made of titanium (Ti), tantalum (Ta), tungsten (W), or molybdenum (Mo). In this embodiment, an aluminum (Al) film containing titanium (Ti) of 0.1 to 2 weight % was made a conductive layer (D) 1545, and a titanium (Ti) film was formed as a conductive layer (E) 1546. It is appropriate that the conductive layer (D) 1545 is made to have a thickness of 200 to 400 nm (preferably 250 to 350 nm), and the conductive layer (E) 1546 is made to have a thickness of 50 to 200 nm (preferably 100 to 150 nm) (FIG. 18A).

For the purpose of forming gate wirings connected to the gate electrode, the conductive layer (E) 1546 and the conductive layer (D) 1545 were subjected to an etching treatment, so that gate wiring lines 1547 and 1548 and a capacitance wiring line 1549 were formed. In the etching treatment, a portion from the surface of the conductive layer (E) to a halfway portion of the conductive layer (D) was first removed by dry etching using a mixture gas of SiCl$_4$, Cl$_2$ and BCl$_3$, and then, the conductive layer (D) was removed by a wet etching using a phosphoric acid based etching solution, so that the gate wiring lines were formed while a selective working property to the under film was kept (FIG. 18B).

A first interlayer insulating film 1550 is formed of a silicon oxide film or a silicon nitride oxide film having a thickness of 500 to 1500 nm, and then contact holes reaching source regions or drain regions formed in the respective island-like semiconductor layers are formed, and source wiring lines 1551 to 1558 and drain wirings 1555 to 1558 are formed. Although not shown, in this embodiment, the electrode was made a laminate film of three-layer structure in which a Ti film having a thickness of 100 nm, an aluminum film containing Ti and having a thickness of 300 nm, and a Ti film having a thickness of 150 nm were continuously formed by sputtering.

Next, as a passivation film 1559, a silicon nitride film, a silicon oxide film, or a silicon nitride oxide film is formed to a thickness of 50 to 500 nm (typically 100 to 300 nm). When hydrogenation processing was carried out in this state, a desirable result for the improvement of characteristics of the TFT was obtained. For example, it was appropriate that a heat treatment in an atmosphere containing hydrogen of 3 to 100% was carried out at 300 to 450° C. for 1 to 12 hours, or a similar effect was obtained even when a plasma hydrogenating method was used. Incidentally, here, an opening portion may be formed in the passivation film 159 at a position where a contact hole for connection of a pixel electrode and a drain wiring is formed later (FIG. 18C).

Figure 19:
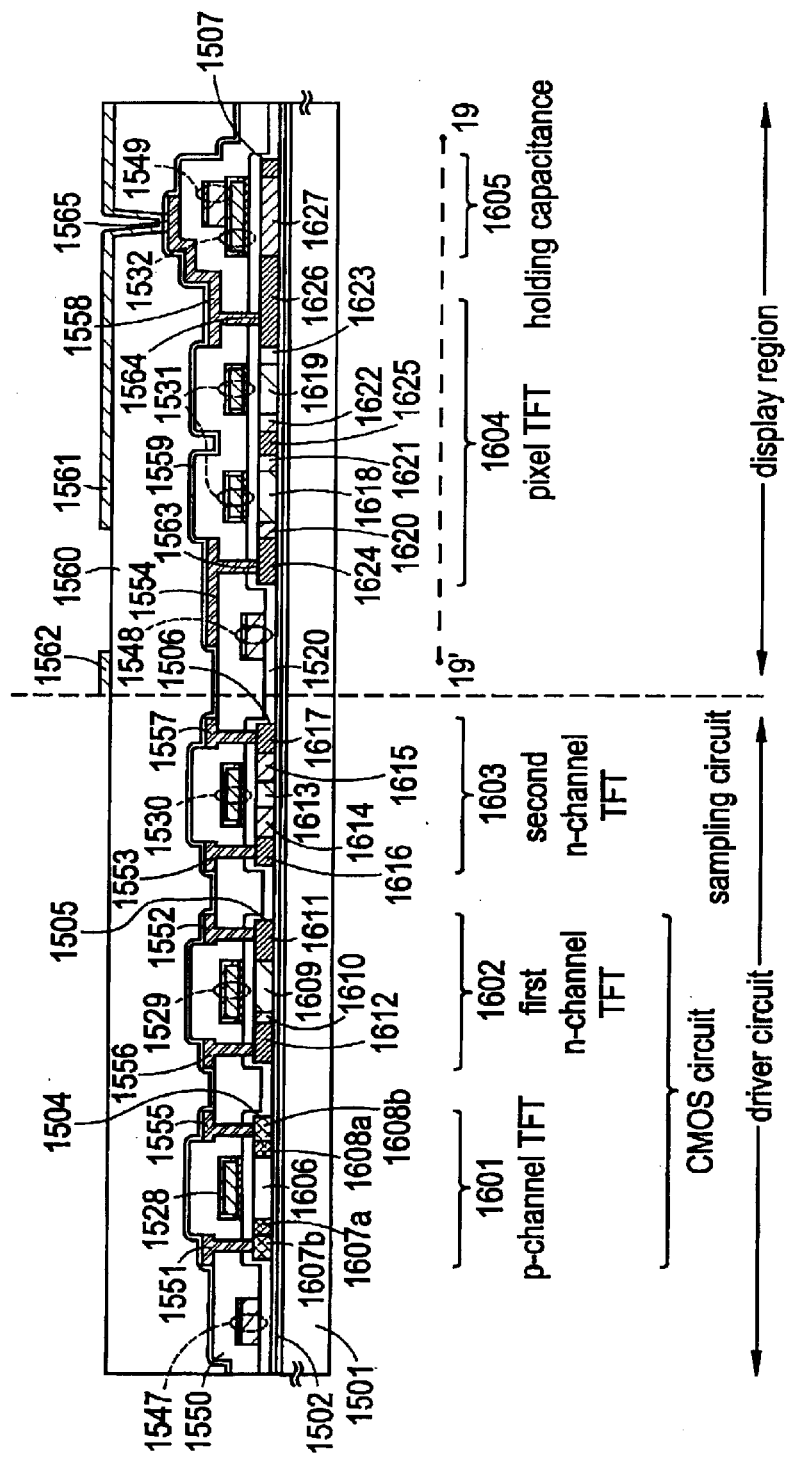
FIG. 19 is a diagram showing an example of a manufacturing process of a pixel TFT and a TFT of a driver circuit.

Thereafter, a second interlayer insulating film 1560 made of organic resin is formed to a thickness of 1.0 to 1.5 µm. As the organic resin, polyimide, acryl, polyamide, polyimidoamide, BCB (benzocyclobutene) or the like can be used. Here, polyimide of a type in which thermal polymerization was made after application to a substrate was used, and the film was formed through firing at 300° C. A contact hole reaching the drain wiring line 1558 is formed in the second interlayer insulating film 1560, and pixel electrodes 1561 and 1562 are formed. As the pixel electrode, in the case where a transmission type liquid crystal display device is formed, a transparent conductive film may be used, and in the case where a reflection type liquid crystal display device is formed, a metal film may be used. In this embodiment, for the purpose of forming the transmission type liquid crystal display device, an indium-tin oxide (ITO) film was formed to a thickness of 100 nm by sputtering (FIG. 19).

In this way, it was possible to complete the substrate including the TFTs of the driver circuit and the pixel TFT of the display region on the same substrate. A p-channel TFT 1601, a first n-channel TFT 1602, and a second n-channel TFT 1603 were formed in the driver circuit, and a pixel TFT 1604 and a holding capacitance 1605 were formed in the display region. In the present specification, for convenience, such a substrate is called an active matrix substrate.

Figure 20:
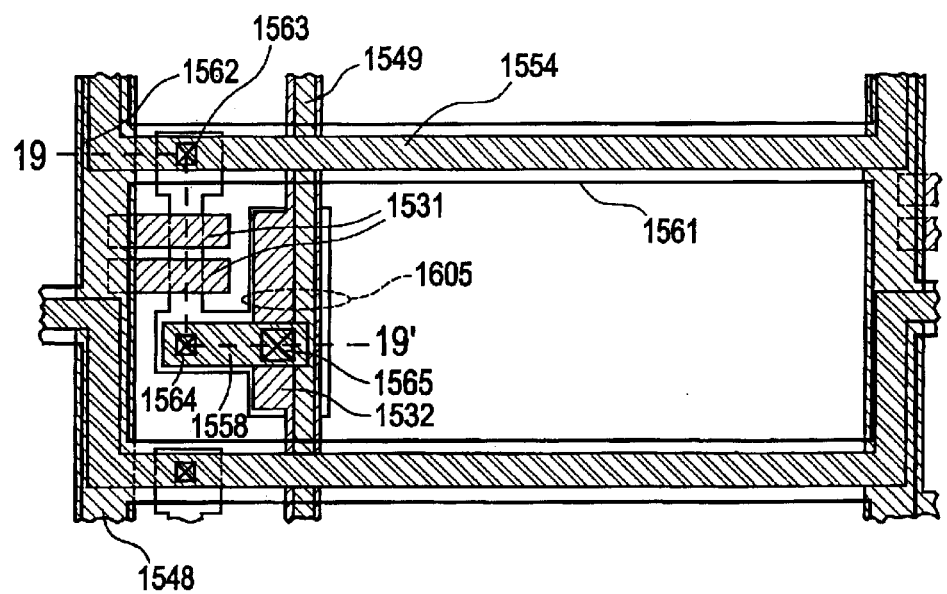
FIG. 20 is a diagram showing a top view of a pixel.

FIG. 20 is a top view showing almost one pixel of the display region. A sectional structure along A—A' shown in FIG. 20 corresponds to the sectional view of the display region shown in FIG. 19. FIG. 20 uses common characters so that the diagram corresponds to the sectional structural views of FIGS. 15A to 19. The gate wiring 1548 intersects with the semiconductor layer 1507 through a not shown gate insulating film. Although not shown, a source region, a drain region, and an Loff region made of an n$^-$ region are formed in the semiconductor layer. Reference numeral 1563 designates a contact portion between the source wiring 1554 and a source region 1624; 1564, a contact portion between the drain wiring line 1558 and a drain region 1626; and 1565, a contact portion between the drain wiring line 1558 and the pixel electrode 1561. The holding capacitance 1605 is formed of a region where a semiconductor layer 1627 extending from the drain region 1626 of the pixel TFT 1604 overlaps with the capacitance wiring lines 1532 and 1549 through the gate insulating film.

The p-channel TFT 1601 of the driver circuit includes, in the island-like semiconductor layer 1504, a channel forming region 1606, source regions 1607a and 1607b, and drain regions 1608a and 1608b. The first n-channel TFT 1602 includes, in the island-like semiconductor layer 1505, a channel forming region 1609, an LDD region 1610 overlapping with the gate electrode 1529 (hereinafter, such an LDD region is referred to as Lov), a source region 1611, and a drain region 1612. The length of this Lov region in the channel length direction was made 0.5 to 3.0 µm, preferably 1.0 to 1.5 µm. The second n-channel TFT 1603 includes, in the island-like semiconductor layer 1506, a channel forming region 1613, LDD regions 1614 and 1615, a source region 1616, and a drain region 1617. In this LDD region, an Lov region and an LDD region which does not overlap with the gate electrode 1530 (hereinafter, such an LDD region is referred to as Loff) are formed, and the length of this Loff region in the channel length direction is 0.3 to 2.0 µm, preferably 0.5 to 1.5 µm. The pixel TFT 1604 includes, in the island-like semiconductor layer 1507, channel forming regions 1618 and 1619, Loff regions 1620 to 1623, and source or drain regions 1624 to 1626. The length of the Loff region in the channel length direction is 0.5 to 3.0 µm, preferably 1.5 to 2.5 µm. Further, the holding capacitance 1605 is formed of the capacitance wirings 1532 and 1549, the insulating film made of the same material as the gate insulating film, and the semiconductor layer 1627 connected to the drain region 1626 of the pixel TFT 1604 and added with the impurity element to give the n type. Besides, it is not necessary that the present invention is limited to the structure of the holding capacitance shown in the embodiment. For example, it is also possible to use a holding capacitance of a structure disclosed in Japanese Patent Application No. Hei. 9-316567, No. Hei. 9-273444 and No. Hei. 10-254097 by the present assignee.

In FIG. 19, although the pixel TFT 1604 is made to have a double gate structure, a single gate structure may be adopted, or a multi-gate structure in which a plurality of gate electrodes are provided may be adopted.

Figure 21:
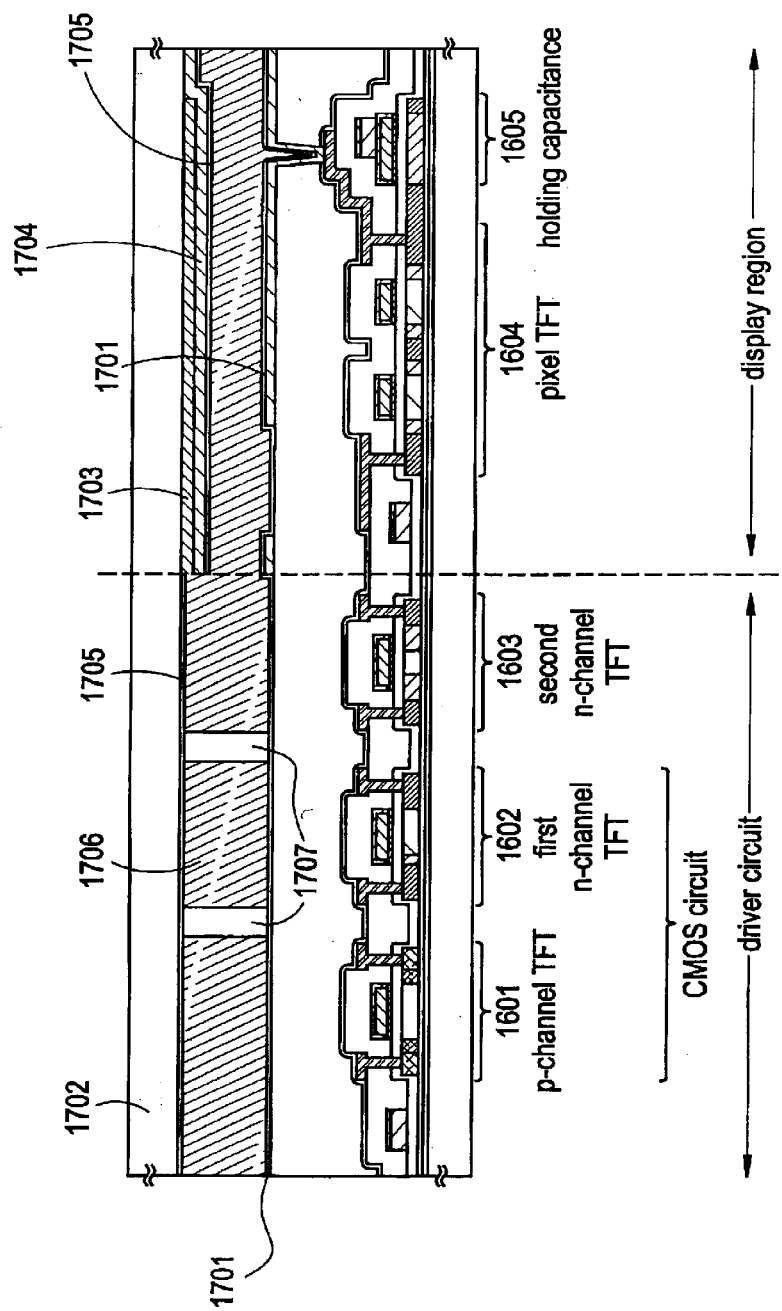
FIG. 21 is a diagram showing the cross-sectional structure of a liquid crystal display device.

A process of fabricating an active matrix liquid crystal display device from the above active matrix substrate will be described. As shown in FIG. 21, an orientation film 1701 was formed over the active matrix substrate of the state of FIG. 19 fabricated by the above method. In general, polyimide resin is often used for the orientation film of a liquid crystal display element. A light shielding film 1703, a transparent conductive film 1704, and an orientation film 1705 were formed on an opposite substrate 1702 at an opposite side. After the orientation film was formed, a rubbing treatment was carried out so that liquid crystal molecules were oriented with a certain constant pre-tilt angle. Then the active matrix substrate on which the pixel matrix circuit and the CMOS circuit are formed was bonded to the opposite substrate by a well-known cell assembling step through a sealing material (not shown), a columnar spacer 1707 or the like. Thereafter, a liquid crystal material 1706 was injected between both substrates, and they were completely sealed by a sealing agent (not shown). As the liquid crystal material, a well-known liquid crystal material may be used. In this way, the active matrix liquid crystal display device shown in FIG. 21 was completed.

As described above, it was possible to fabricate the active matrix liquid crystal display device in which the structures of the TFTs forming the respective circuits are optimized according to the specification required by the pixel TFT and the driver circuit.

Embodiment 4

Figure 22A:
FIGS. 22A to 22C are diagrams showing an example of a manufacturing process of the present invention.
Figure 22B:
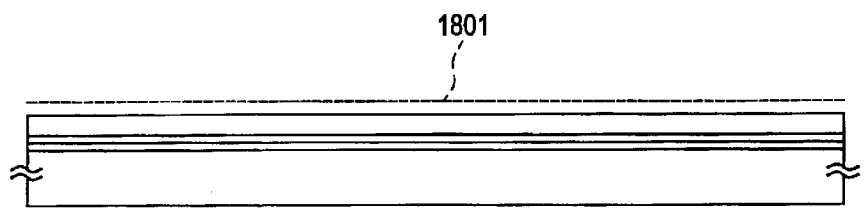
Figure 22C:
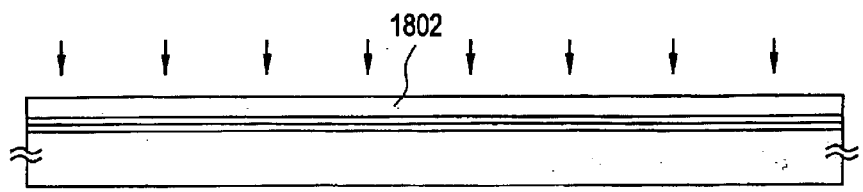

Referring to FIGS. 22A to 22C, an example of using another method of crystallization, substituting the crystallization step in Embodiment 3, is shown here in Embodiment 4.

First, the state of FIG. 22A is obtained in accordance with Embodiment 3. Note that FIG. 22A corresponds to FIG. 15A.

A catalyst element for promoting crystallization (one or plural kinds of elements selected from a group consisting of nickel, cobalt, germanium, tin, lead, palladium, iron, and copper, typically nickel) is used for performing crystallization. Specifically, laser crystallization is performed under a state in which the catalyst element is maintained in a surface of an amorphous silicon film to transform the amorphous silicon film into a crystalline silicon film. In Embodiment 4, an aqueous solution containing nickel element (aqueous nickel acetate solution) is applied to the amorphous silicon film by spin coating to form a catalyst-element-containing layer 1801 on the entire surface of an amorphous semiconductor film 1503a. (FIG. 22B) The spin coating method is employed as a means of doping nickel in Embodiment 4. However, other methods such as evaporation and sputtering may be used for forming a thin film containing a catalyst element (nickel film in the case of Embodiment 4) on the amorphous semiconductor film.

Employing the method of irradiating a laser stated in accordance with the present invention, for example, Embodiment 1 of the present invention, a crystalline silicon film 1802 is formed next. (FIG. 22C)

By performing the rest of the process in accordance with the steps after FIG. 15C indicated in Embodiment 3, the structure shown in FIG. 21 can be attained If an island-like semiconductor layer is manufactured from the amorphous silicon film crystallized by using a catalyst element as in Embodiment 4, a very small amount of the metal element will remain in the island-like semiconductor film. Of course, it is still possible to complete a TFT under this state, but preferably better to remove at least the catalyst element that remains in a channel-forming region. As a means of removing the catalyst element residue, there is a method of utilizing a gettering action of phosphorous (P). The concentration of phosphorous (P) necessary for gettering is approximately the same level as the concentration in the impurity region ($n^+$) formed in FIG. 17B. Accordingly, by means of the heat treatment in the activation step shown in FIG. 17D, the catalyst element in the channel-forming region of the n-channel type TFT and the p-channel type TFT can be gettered therefrom.

There are other means for removing the catalyst element without being particularly limited. For example, after forming the island-shape semiconductor layer, heat treatment is performed on the crystalline semiconductor film with a catalyst element residue at a temperature between 800 and 115° C. (preferably between 900 and 1000° C.) for 10 minutes to 4 hours (preferably between 30 minutes and 1 hour) in an oxygenous atmosphere to which 3 to 10 volume % of hydrogen chloride is contained. Through this step, the nickel in the crystalline semiconductor film becomes a volatile chloride compound (nickel chloride) and is eliminated in the treatment atmosphere during the operation. In other words, it is possible to remove nickel by the gettering action of a halogen element.

A plural number of means may be used in combination to remove the catalyst element. Also, gettering may be performed prior to the formation of the island-like semiconductor layer.

Embodiment 5

Referring to FIGS. 23A to 23D, an example of using another method of crystallization, substituting the crystallization step in Embodiment 3, is shown here in Embodiment 5.

Figure 23A:
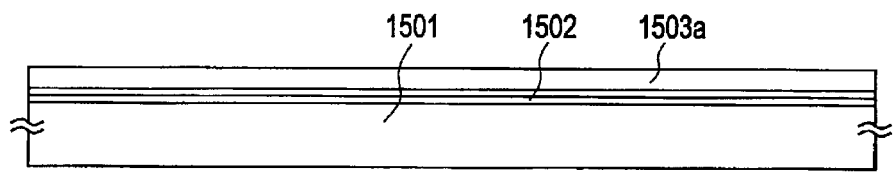
FIGS. 23A to 23D are diagrams showing an example of a manufacturing process of the present invention.
Figure 23B:
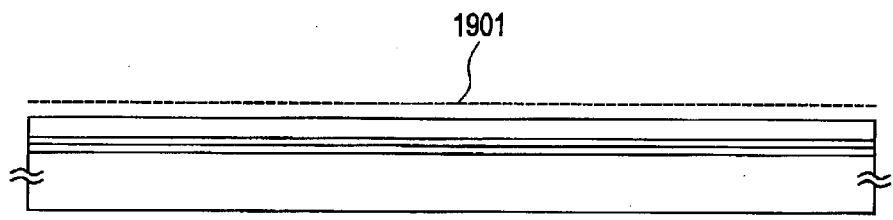
Figure 23C:
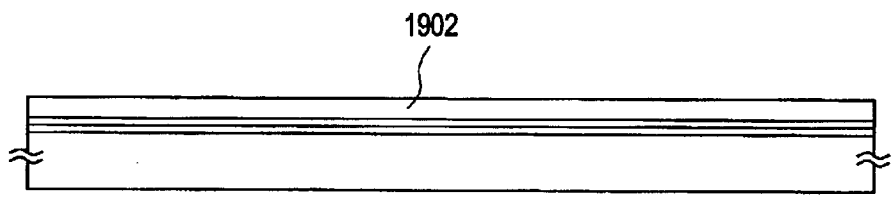

First, the state of FIG. 23A is obtained in accordance with Embodiment 3. Note that FIG. 23A corresponds to FIG. 15A.

First, an aqueous solution containing a catalyst element (nickel, in this Embodiment) (aqueous nickel acetate solution) is applied to an amorphous silicon film by spin coating to form a catalyst element-containing layer 1902 on the entire surface of an amorphous semiconductor film 1503a. (FIG. 23B) Possible catalyst elements other than nickel (Ni) that can be used here are elements such as germanium (Ge), iron (Fe), palladium (Pd), tin (Sn), lead (Pb), cobalt (Co), platinum (Pt), copper (Cu), and gold (Au).

The spin coating method is employed as a means of doping nickel in Embodiment 5. However, other methods such as evaporation and sputtering may be used for forming a thin film made of a catalyst element (nickel film in the case of Embodiment 5) on the amorphous semiconductor film. Though the example of forming the catalyst element-containing layer 1902 on the entire surface of the amorphous semiconductor film 1503a is shown here in Embodiment 5, a mask may be formed to selectively form the catalyst element-containing layer.

Heat treatment is performed next at a temperature between 500 and 650° C. (preferably between 550 and 600° C.) for a duration of 6 to 16 hours (preferably between 8 and 14 hours). Consequently, crystallization is advanced and a crystalline semiconductor film (crystalline silicon film in Embodiment 5) 1902 is formed. (FIG. 23C) In the case of selectively forming the catalyst element-containing layer, with an opening of the mask as the starting point, crystallization advances in the direction substantially parallel (the direction indicated by an arrow) with the substrate. A crystalline silicon film that has uniform crystal growth direction when viewed macroscopically is thus formed.

Figure 23D:
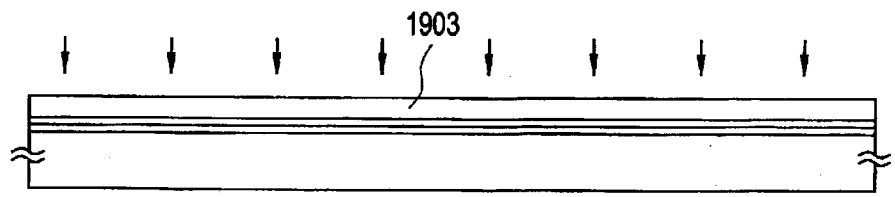

There are many defects included in the crystalline silicon film crystallized by the above method due to the low crystallization temperature, and there are cases in which it is insufficient for use as a semiconductor element material. Thus, in order to increase the crystallinity of the crystalline silicon film, the film is irradiated with a laser beam using the laser irradiation method in accordance with the present invention, for example, Embodiment 2. A crystalline silicon film 1903 having good crystallinity is thus formed. (FIG. 23D)

By performing the rest of the process in accordance with the steps after FIG. 15C indicated in Embodiment 3, the structure shown in FIG. 21 can be attained.

Note that similar to Embodiment 4, it is further preferable to remove the catalyst element that will remain at least from the channel-forming region. Accordingly, it is also desirable that gettering be performed by using the method indicated in Embodiment 3.

Embodiment 6

Figure 14:
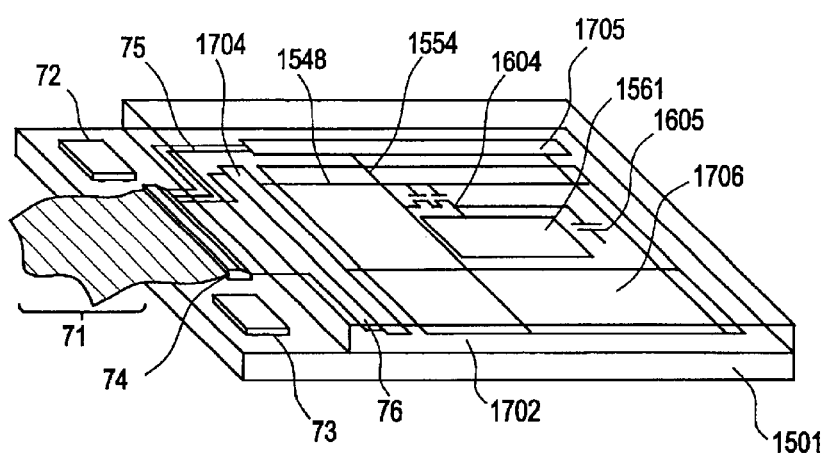
FIG. 14 is a diagram showing the outer appearance of an AM-LCD.

The structure of an active matrix liquid crystal display device indicated in Embodiment 3 is explained using the perspective view of FIG. 14. Note that in order to give correspondence with the diagrams of FIGS. 15A to 20, common symbols are used for FIG. 14.

In FIG. 14, an active matrix substrate is structured by a display region 1706, a scanning signal driver circuit 1704, and an image signal driver circuit 1705 formed on a glass substrate 1501. A pixel TFT 1604 is provided in the display region, and the driver circuits formed in the periphery thereof are structured with CMOS circuit as a base. The scanning signal driver circuit 1704 and the image signal driver circuit 1705 are connected to the pixel TFT 1604 by a gate wiring 1531 and a source wiring 1554, respectively. Further, an FPC 71 is connected to an external input terminal 74, and is connected via input wirings 75 and 76 to the respective driver circuits. Reference symbol 1702 denotes an opposing substrate 1702.

Embodiment 7

In this embodiment, an example in which an EL (electroluminescence) display device (also called as light emitting display device) is fabricated by using the present invention will be described.

Figure 24A:
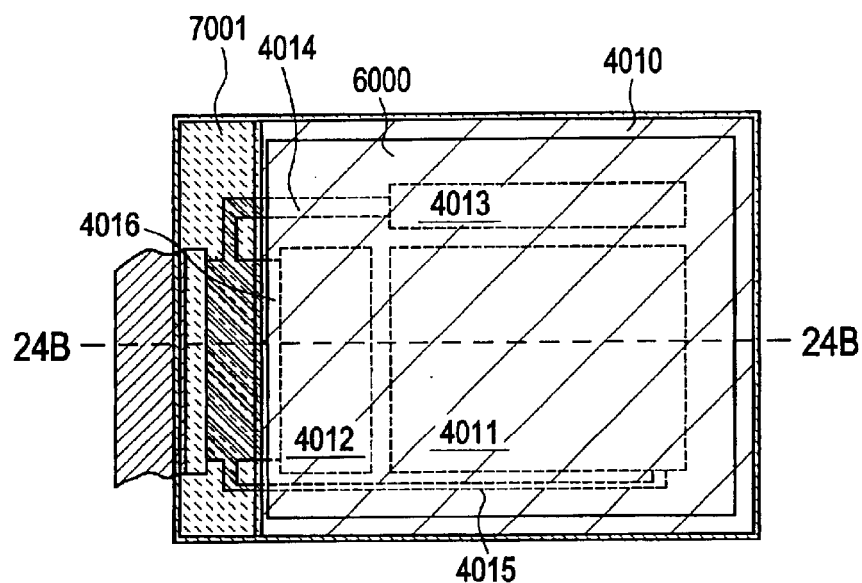
FIGS. 24A and 24B are diagrams showing the structure of an active matrix EL display device.

FIG. 24A is a top view of an EL display device using the present invention. In FIG. 24A, reference numeral 4010 designates a substrate; 4011, a pixel portion; 4012, a source side driver circuit; and 4013, a gate side driver circuit, and the respective driver circuits lead to an FPC 4017 through wirings 4014 to 4016 and are connected to an external equipment.

At this time, a cover member 6000, a sealing member (also called a housing member) 7000, and a sealant (second sealing member) 7001 are provided so as to surround at least the pixel portion, preferably the driver circuits and the pixel portion.

Figure 24B:
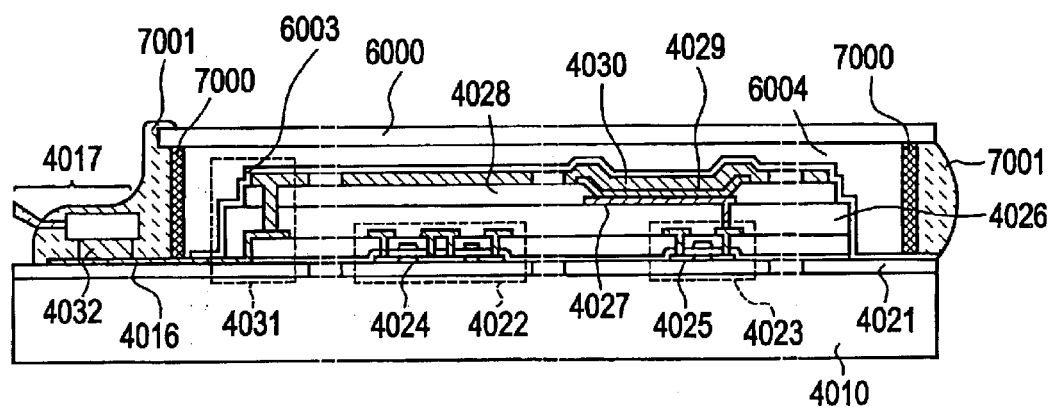

FIG. 24B is a view showing a sectional structure of the EL display device of this embodiment. A driver circuit TFT (here, a CMOS circuit of a combination of an n-channel TFT and a p-channel TFT is shown) 4022 and a pixel portion TFT 4023 (here, only a TFT for controlling a current to an EL element is shown) are formed on the substrate 4010 and an under film 4021. These TFTs may be formed by using a well-known structure (top gate structure or bottom gate structure).

The present invention can be used for the formation of crystalline semiconductor layers for the driver circuit TFT 4022 and the pixel portion TFT 4023.

When the driver circuit TFT 4022 and the pixel portion TFT 4023 are completed by using the present invention, a pixel electrode 4027 electrically connected to a drain of the pixel portion TFT 4023 and made of a transparent conductive film is formed on an interlayer insulating film (flattening film) 4026 made of resin material. As the transparent conductive film, a compound (called ITO) of indium oxide and tin oxide or a compound of indium oxide and zinc oxide can be used. After the pixel electrode 4027 is formed, an insulating film 4028 is formed, and an opening portion is formed over the pixel electrode 4027.

Next, an EL layer 4029 is formed. As the EL layer 4029, a laminate structure or a single layer structure may be adopted by freely combining well-known EL materials (hole injecting layer, hole transporting layer, light emitting layer, electron transporting layer, and electron injecting layer). A well-known technique may be used to determine the structure. The EL material includes a low molecular material and a high molecular (polymer) material. In the case where the low molecular material is used, an evaporation method is used. In the case where the high molecular material is used, it is possible to use a simple method such as a spin coating method, a printing method or an ink jet method. In general, the EL display device or a light emitting device referred to in the present specification may include triplet-based light emission devices and/or singlet-based light emission devices, for example.

In this embodiment, the EL-layer is formed by the evaporation method using a shadow mask. Color display becomes possible by forming light emitting layers (red light emitting layer, green light emitting layer, and blue light emitting layer), which can emit lights with different wavelengths, for every pixel by using the shadow mask. In addition, there are a system in which a color conversion layer (CCM) and a color filter are combined, and a system in which a white light emitting layer and a color filter are combined, and either system may be used. Of course, an EL display device of monochromatic light emission may be used.

After the EL layer 4029 is formed, a cathode 4030 is formed thereon. It is desirable to remove moisture and oxygen existing in the interface between the cathode 4030 and the EL layer 4029 to the utmost. Thus, it is necessary to make such contrivance that the EL layer 4029 and the cathode 4030 are continuously formed in vacuum, or the EL layer 4029 is formed in an inert gas atmosphere and the cathode 4030 is formed without releasing to the atmosphere. In this embodiment, a film formation apparatus of a multi-chamber system (cluster tool system) is used, so that the foregoing film formation is made possible.

Incidentally, in this embodiment, a laminate structure of a LiF (lithium fluoride) film and an Al (aluminum) film is used for the cathode 4030. Specifically, the LiF (lithium fluoride) film having a thickness of 1 nm is formed on the EL layer 4029 by the evaporation method, and the aluminum film having a thickness of 300 nm is formed thereon. Of course, a MgAg electrode of a well-known cathode material may be used. The cathode 4030 is connected to the wiring 4016 in a region designated by 4031. The wiring 4016 is a power supply line for giving a predetermined voltage to the cathode 4030, and is connected to the FPC 4017 through a conductive paste material 4032.

For the purpose of electrically connecting the cathode 4030 to the wiring 4016 in the region 4031, it is necessary to form contact holes in the interlayer insulating film 4026 and the insulating film 4028. These may be formed at the time of etching the interlayer insulating film 4026 (at the time of forming the contact hole for the pixel electrode) and at the time of etching the insulating film 4028 (at the time of forming the opening portion before formation of the EL layer). When the insulating film 4028 is etched, the interlayer insulating film 4026 may be etched together. In this case, if the interlayer insulating film 4026 and the insulating film 4028 are made of the same resin material, the shape of the contact hole can be made excellent.

A passivation film 6003, a filler 6004, and a cover member 6000 are formed to cover the surface of the EL element formed in this way.

Further, the sealing member is provided at the inside of the cover member 6000 and the substrate 4010 in such a manner as to cover the EL element portion, and further, the sealant (second sealing member) 7001 is formed at the outside of the sealing member 7000.

At this time, this filler 6004 functions also as an adhesive for bonding the cover member 6000. As the filler 6004, PVC (polyvinyl chloride), epoxy resin, silicone resin, PVB (polyvinyl butyral) or EVA (ethylene-vinyl acetate) can be used. It is preferable that a drying agent is provided in the inside of this filler 6004, since a moisture absorption effect can be held.

A spacer may be contained in the filler 6004. At this time, the spacer may be made a granular material of BaO or the like, and the spacer itself may be made to have a moisture absorption property.

In the case where the spacer is provided, the passivation film 6003 can relieve spacer pressure. In addition to the passivation film, a resin film or the like for relieving the spacer pressure may be provided.

As the cover member 6000, a glass plate, an aluminum plate, a stainless plate, an FRP (Fiberglass-Reinforced Plastics) plate, a PVF (polyvinyl fluoride) film, a Mylar film, a polyester film, or an acryl film can be used. In the case where PVB or EVA is used for the filler 6004, it is preferable to use a sheet of a structure in which an aluminum foil of several tens of $\mu$m is put between PVF films or Mylar films.

However, according to the direction of light emission (radiation direction of light) from the EL element, it is necessary that the cover member 6000 has transparency.

The wiring 4016 is electrically connected to the FPC 4017 through the gap between the substrate 4010 and the sealing member 7000 or the sealant 7001. Incidentally, here, although the description has been made on the wiring line 4016, the other wiring lines 4014 and 4015 are also electrically connected to the FPC 4017 through a space under the sealing member 7000 and the sealant 7001 in the same way.

Embodiment 8

In this embodiment, an example in which an EL display device different from Embodiment 7 is fabricated by using the present invention will be described with reference to FIGS. 25A and 25B. Since the same reference numerals as those of FIGS. 24A and 24B designate the same portions, the explanation is omitted.

Figure 25A:
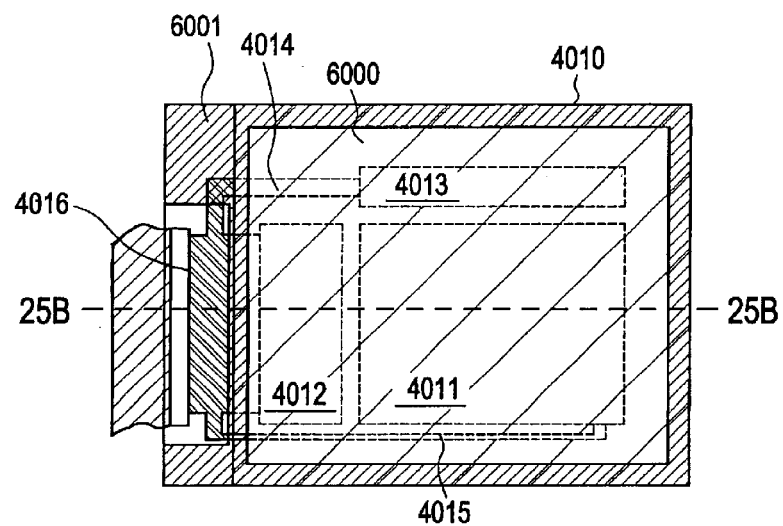
FIGS. 25A and 25B are diagrams showing the structure of an active matrix EL display device.
Figure 25B:
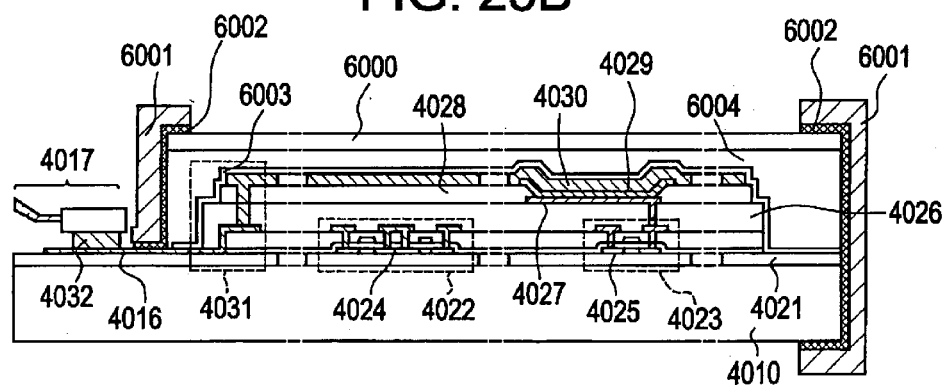

FIG. 25A is a top view of an EL display device of this embodiment, and FIG. 25A is a sectional view taken along line A-A' of FIG. 25A.

In accordance with Embodiment 7, steps are carried out until a passivation film 6003 covering the surface of an EL element is formed.

Further, a filler 6004 is provided so as to cover the EL element. This filler 6004 functions also as an adhesive for bonding a cover member 6000. As the filler 6004, PVC (polyvinyl chloride), epoxy resin, silicone resin, PVB (polyvinyl butyral) or EVA (ethylene-vinyl acetate) can be used. It is preferable that a drying agent is provided in the inside of this filler 6004, since a moisture absorption effect can be held.

A spacer may be contained in the filler 6004. At this time, the spacer may be made a granular material of BaO or the like, and the spacer itself may be made to have a moisture absorption property.

In the case where the spacer is provided, the passivation film 6003 can relieve spacer pressure. In addition to the passivation film, a resin film or the like for relieving the spacer pressure may be provided.

As the cover member 6000, a glass plate, an aluminum plate, a stainless plate, an FRP (Fiberglass-Reinforced Plastics) plate, a PVF (polyvinyl fluoride) film, a Mylar film, a polyester film, or an acryl film can be used. In the case where PVB or EVA is used for the filler 6004, it is preferable to use a sheet of a structure in which an aluminum foil of several tens of $\mu$m is put between PVF films or Mylar films.

However, according to the direction of light emission (radiation direction of light) from the EL element, it is necessary that the cover member 6000 has transparency.

Next, after the cover member 6000 is bonded by using the filler 6004, a frame member 6001 is attached so as to cover the side (exposed surface) of the filler 6004. The frame member 6001 is bonded by a sealing member (functioning as an adhesive) 6002. At this time, as the sealing member 6002, although it is preferable to use a photo-curing resin, if heat resistance of the EL layer permits, a thermosetting resin may be used. Incidentally, it is desirable that the sealing member 6002 is a material which is as impermeable as possible to moisture and oxygen. A drying agent may be added in the inside of the sealing member 6002.

A wiring line 4016 is electrically connected to an FPC 4017 through a gap between the sealing member 6002 and a substrate 4010. Here, although description has been made on the wiring 4016, other wirings 4014 and 4015 are also electrically connected to the FPC 4017 through a space under the sealing member 6002 in the same manner.

Embodiment 9

Figure 27A:
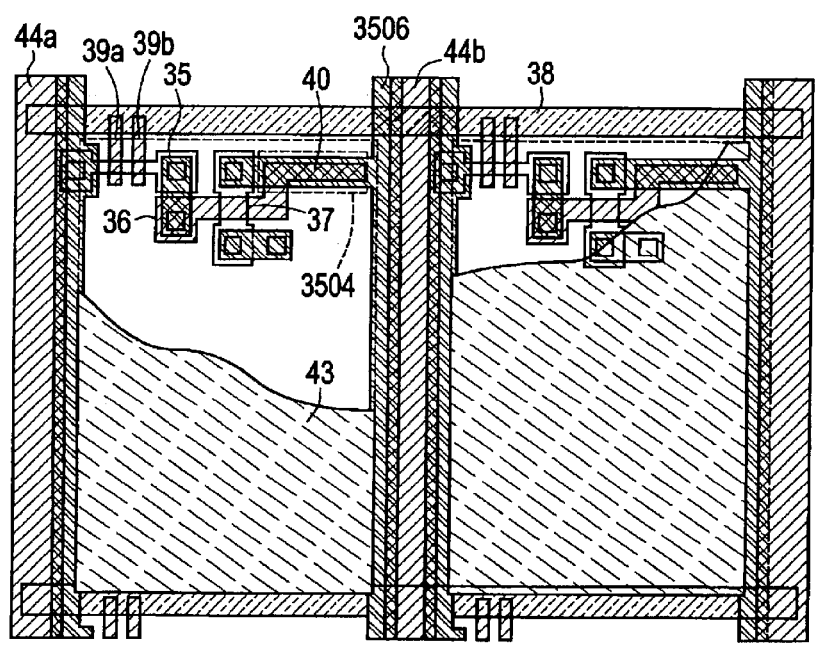
FIGS. 27A and 27B are diagrams showing the structure of an active matrix EL display device.
Figure 27B:
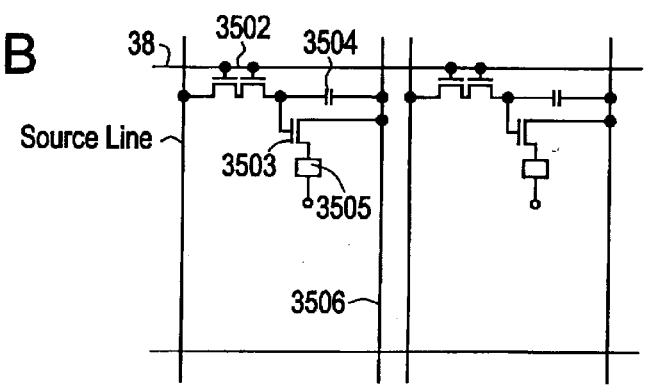

The present invention can be used for the manufacture of TFTs in an EL display panel made of a structure like Embodiment 7 or Embodiment 8. Here, a more detailed sectional structure of a pixel portion is shown in FIG. 26, its upper structure is shown in FIG. 27A, and its circuit diagram is shown in FIG. 27B. In FIGS. 26, 27A and 27B, since common characters are used, reference may be made to one another.

In FIG. 26, a switching TFT 3502 provided on a substrate 3501 is formed by using an NTFT of the present invention (see Embodiments 1 to 6). In this embodiment, although a double gate structure is used, since there is no big difference in the structure and fabricating process, explanation is omitted. However, a structure in which two TFTs are essentially connected in series with each other is obtained by adopting the double gate structure, and there is a merit that an off current value can be decreased. Incidentally, although the double gate structure is adopted in this embodiment, a single gate structure may be adopted, or a triple gate structure or a multi-gate structure having more gates may be adopted. Further, it may be formed by using a PTFT of the present invention.

A current controlling TFT 3503 is formed by using an NTFT. At this time, a drain wiring 35 of the switching TFT 3502 is electrically connected to a gate electrode 37 of the current controlling TFT. A wiring designated by 38 is a gate wiring for electrically connecting gate electrodes 39a and 39b of the switching TFT 3502.

At this time, since the current controlling TFT 3503 is an element for controlling the amount of current flowing through an EL element, a large current flows, and it is an element having high fear of deterioration due to heat or deterioration due to hot carriers. Thus, it is very effective to adopt a structure in which an LDD region is provided at a drain side of the current controlling TFT so as to overlap with a gate electrode through a gate insulating film.

In this embodiment, although the current controlling TFT 3503 is shown as a single gate structure, a multi-gate structure in which a plurality of TFTs are connected in series with each other may be adopted. Further, such a structure may be adopted that a plurality of TFTs are connected in parallel with each other to essentially divide a channel forming region into plural portions, so that radiation of heat can be made at high efficiency. Such structure is effective as a countermeasure against deterioration due to heat.

Further, as shown in FIG. 27A, the wiring which becomes the gate electrode 37 of the current controlling TFT 3503 overlaps with a drain wiring 40 of the current controlling TFT 3503 through an insulating film in a region designated by 3504. At this time, a capacitor is formed in the region 3504. This capacitor 3504 functions as a capacitor for holding voltage applied to the gate of the current controlling TFT 3503. Incidentally, the drain wiring 40 is connected to a current supply line (power source line) 3506 and a constant voltage is always applied.

A first passivation film 41 is provided on the switching TFT 3502 and the current controlling TFT 3503, and a flattening film 42 made of a resin insulating film is formed thereon. It is very important to flatten a stepped portion due to the TFT by using the flattening film 42. Since an EL layer formed later is very thin, there is a case where poor light emission occurs due to the existence of the stepped portion. Thus, it is desirable to conduct flattening prior to formation of a pixel electrode so that the EL layer can be formed on the flattest possible surface.

Reference numeral 43 designates a pixel electrode (cathode of the EL element) made of a conductive film having high reflectivity, and is electrically connected to the drain of the current controlling TFT 3503. As the pixel electrode 43, it is preferable to use a low resistance conductive film, such as an aluminum alloy film, a copper alloy film or a silver alloy film, or a laminate film of those. Of course, a laminate structure with another conductive film may be adopted.

A light emitting layer 45 is formed in a groove (corresponding to a pixel) formed by banks 44a and 44b made of insulating films (preferably resin). Incidentally, here, although only one pixel is shown, light emitting layers corresponding to respective colors of R (red), G (green) and B (blue) may be separately formed. As an organic EL material used for the light emitting layer, a conjugated polymer material is used. As a typical polymer material, polyparaphenylene vinylene (PPV) system, polyvinylcarbazole (PVK) system, polyfluorene system and the like are enumerated.

Although various types exist as the PPV organic EL material, for example, a material as disclosed in "H. Shenk, H. Becker, O Gelsen, E. Kluge, W. Kreuder, and H. Spreitzer, "Polymers for Light Emitting Diodes", Euro Display, Proceedings, 1999, p. 33–37" or Japanese Patent Application Laid-open No. Hei. 10-92576 may be used.

As a specific light emitting layer, it is appropriate that cyanopolyphenylenevinylene is used for a light emitting layer emitting red light, polyphenylenevinylene is used for a light emitting layer emitting green light, and polyphenylenevinylene or polyalkylphenylene is used for a light emitting layer emitting blue light. It is appropriate that the film thickness is made 30 to 150 nm (preferably 40 to 100 nm).

However, the above examples are only examples of the organic EL material which can be used for the light emitting layer, and it is not necessary to limit the invention to these. The EL layer (layer in which light emission and movement of carriers for that are performed) may be formed by freely combining a light emitting layer, a charge transporting layer and a charge injecting layer.

For example, although this embodiment shows the example in which the polymer material is used for the light emitting layer, a low molecular organic EL material may be used. It is also possible to use an inorganic material, such as silicon carbide, as the charge transporting layer or the charge injecting layer. As the organic EL material or inorganic material, a well-known material can be used.

This embodiment adopts the EL layer of a laminate structure in which a hole injecting layer 46 made of PEDOT (polythiophene) or PAni (polyaniline) is provided on the light emitting layer 45. An anode 47 made of a transparent conductive film is provided on the hole injecting layer 46. In the case of this embodiment, since light generated in the light emitting layer 45 is radiated to an upper surface side (to the upper side of the TFT), the anode must be translucent. As the transparent conductive film, a compound of indium oxide and tin oxide or a compound of indium oxide and zinc oxide can be used. However, since the film is formed after the light emitting layer and the hole injecting layer having low heat resistance is formed, it is preferable that film formation can be made at the lowest possible temperature.

At the point when the anode 47 has been formed, an EL element 3505 is completed. Incidentally, the EL element 3505 here indicates a capacitor formed of the pixel electrode (cathode) 43, the light emitting layer 45, the hole injecting layer 46 and the anode 47. As shown in FIG. 27A, since the pixel electrode 43 is almost coincident with the area of the pixel, the whole pixel functions as the EL element. Thus, use efficiency of light emission is very high, and bright image displaying becomes possible.

In this embodiment, a second passivation film 48 is further provided on the anode 47. As the second passivation film 48, a silicon nitride film or a silicon nitride oxide film is desirable. This object is to insulate the EL element from the outside, and has both the meaning of preventing deterioration due to oxidation of the organic EL material and the meaning of suppressing degassing from the organic EL material. By this, the reliability of the EL display device is raised.

As described above, the EL display panel includes the pixel portion made of the pixel of the structure as shown in FIG. 26, and includes the switching TFT having a sufficiently low off current value and the current controlling TFT resistant to hot carrier injection. Thus, it is possible to obtain the EL display panel which has high reliability and can make excellent image display.

Incidentally, the structure of this embodiment can be freely combined with the structure of Embodiments 1 to 6. Further, it is effective to use the EL display panel of this embodiment as a display portion of an electronic equipment.

Embodiment 10

Figure 28:
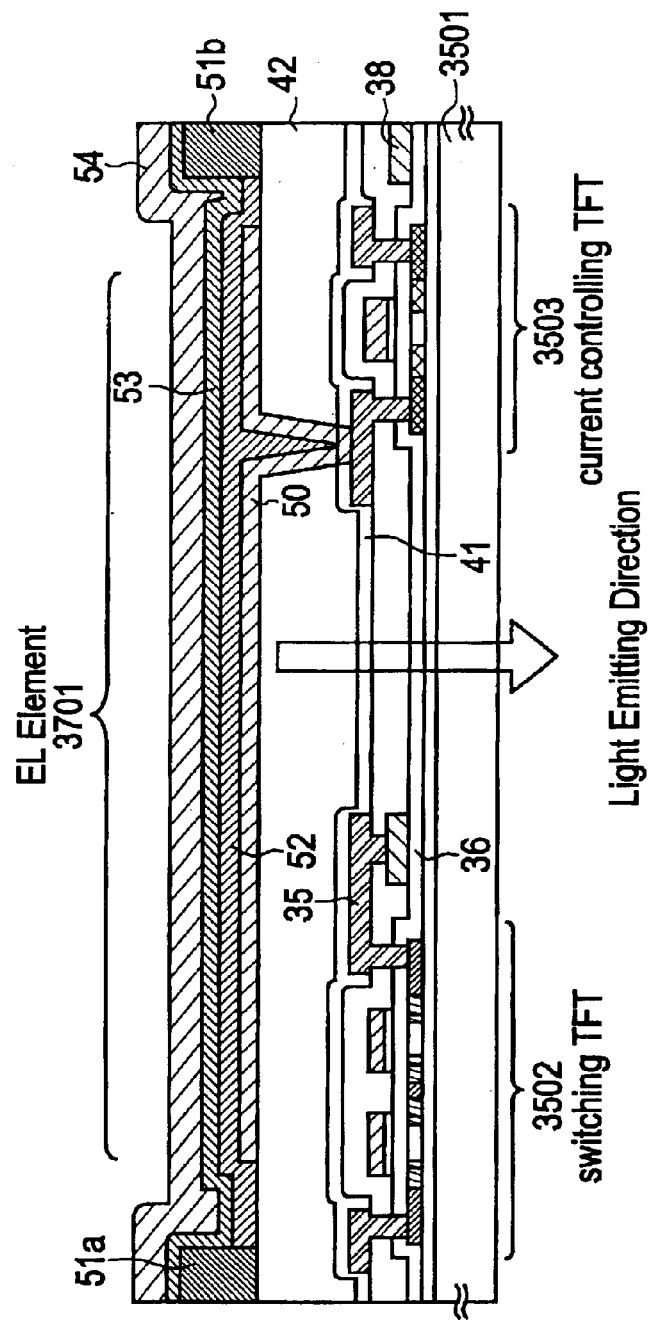
FIG. 28 is a diagram showing the structure of an active matrix EL display device.

In this embodiment, a description will be made on a structure in which the structure of the EL element 3505 is inverted in the pixel portion shown in Embodiment 9. FIG. 28 is used for the description. Incidentally, points different from the structure of FIG. 26 are only a portion of an EL element and a current controlling TFT, the other explanation is omitted.

In FIG. 28, a current controlling TFT 3503 is formed by using a PTFT. With respect to a fabricating process, reference may be made to Embodiments 1 to 9.

In this embodiment, a transparent conductive film is used as a pixel electrode (anode) 50. Specifically, a conductive film made of a compound of indium oxide and zinc oxide is used. Of course, a conductive film made of a compound of indium oxide and tin oxide may be used.

After banks 51a and 51b made of insulating films are formed, a light emitting layer 52 made of polyvinylcarbazole is formed by solution application. An electron injecting layer 53 made of potassium acetylacetonate (expressed as acacK), and a cathode 54 made of aluminum alloy are formed thereon. In this case, the cathode 54 functions also as a passivation film. In this way, an EL element 3701 is formed.

In the case of this embodiment, light generated in the light emitting layer 52 is radiated, as indicated by an arrow, to the substrate on which TFTs are formed.

Incidentally, the structure of this embodiment can be freely combined with the structure of Embodiments 1 to 6. Further, it is effective to use the EL display panel of this embodiment as a display portion of an electronic equipment.

Embodiment 11

In this embodiment, an example of a case where a pixel is made to have a structure different from the circuit diagram shown in FIG. 27B will be described with reference to FIGS. 29A to 29C. In this embodiment, reference numeral 3801 designates a source wiring of a switching TFT; 3803, a gate wiring of the switching TFT 3802; 3804, a current controlling TFT; 3805, a capacitor; 3806, 3808, current supply lines; and 3807, an EL element.

Figure 29A:
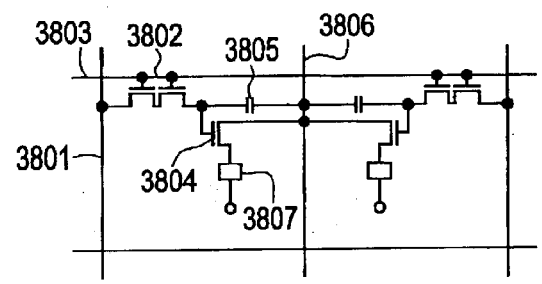
FIGS. 29A to 29C are diagrams showing a circuit configuration of an active matrix EL display device.

FIG. 29A shows an example in which the current supply line 3806 is made common between two pixels. That is, it is characterized in that the two pixels are formed to become axisymmetric with respect to the current supply line 3806. In this case, since the number of power supply lines can be decreased, the pixel portion can be made further fine.

Figure 29B:
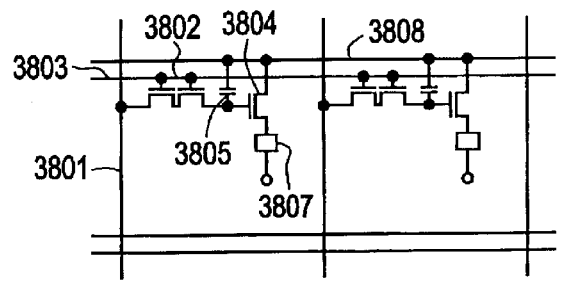

FIG. 29B shows an example in which the current supply line 3808 is provided in parallel with the gate wiring 3803. Incidentally, although FIG. 29B shows the structure in which the current supply line 3808 does not overlap with the gate wiring 3803, if both are wirings formed in different layers, they can be provided so that they overlap with each other through an insulating film. In this case, since an occupied area can be made common to the power supply 3808 and the gate wiring 3803, the pixel portion can be further made fine.

Figure 29C:
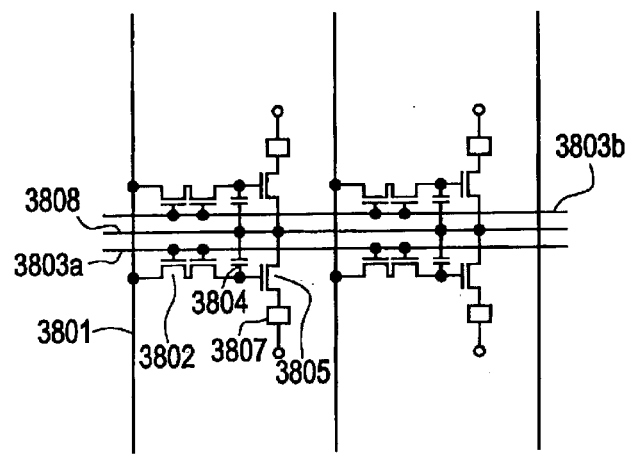

The structure of FIG. 29C is characterized in that the current supply line 3808 is provided in parallel with gate wirings 3803a and 3803b similarly to the structure of FIG. 29B, and further, two pixels are formed so they become axisymmetric with respect to the current supply line 3808. Besides, it is also effective to provide the current supply line 3808 in such a manner that it overlaps with either one of the gate wirings 3803a and 3803b. In this case, since the number of power supply lines can be decreased, the pixel portion can be made further fine.

Incidentally, the structure of this embodiment can be freely combined with the structure of Embodiments 1 to 10.

Besides, it is effective to use the EL display panel having the pixel structure of this embodiment as a display portion of an electronic equipment.

Embodiment 12

Although FIGS. 27A and 27B of Embodiment 9 show the structure in which the capacitor 3504 is provided to hold the voltage applied to the gate of the current controlling TFT 3503, the capacitor 3504 can also be omitted. In the case of Embodiment 9, since an NTFT as shown in Embodiments 1 to 12 is used as the current controlling TFT 3503, it includes the LDD region provided so as to overlap with the gate electrode through the gate insulating film. Although a parasitic capacitance generally called a gate capacitance is formed in this overlapping region, this embodiment is characterized in that this parasitic capacitance is positively used instead of the capacitor 3504.

Since the capacity of this parasitic capacitance is changed by the overlapping area of the gate electrode and the LDD region, it is determined by the length of the LDD region contained in the overlapping region.

Also in the structures shown in FIGS. 29A, 29B and 29C of Embodiment 11, the capacitor 3805 can be similarly omitted.

Incidentally, the structure of this embodiment can be freely combined with the structure of Embodiments 1 to 11. Besides, it is effective to use the EL display panel having the pixel structure of this embodiment as a display portion of an electronic equipment of Embodiments 13 to 15.

Embodiment 13

The present invention may be applied to all conventional IC techniques. That is, it is applicable to all semiconductor circuits now in circulation in the markets. For example, the present invention may be applied to a microprocessor integrated on one chip, such as a RISC processor, a ASIC processor, or a signal processing circuit, typically a driver circuit for liquid crystals (such as a D/A converter, a y correction circuit, a signal dividing circuit), and high frequency circuits for mobile equipment (portable phone, PHS, mobile computer).

Further, a semiconductor circuit such as a microprocessor is mounted in various kinds of electronic equipment functioning as central circuit. As typical electronic equipment, a personal computer, a portable information terminal, or other household appliances may be enumerated. Additionally, a computer for controlling vehicles (an automobile, a train, and so forth) may be given. The present invention is applicable to these types of semiconductor devices.

Any of the constitutions of Embodiments 1 through 12 may be adopted for manufacturing the semiconductor device indicated in Embodiment 13, or the constitutions of the respective embodiments may be freely combined.

Embodiment 14

TFTs formed through carrying out the present invention may be applied to various electro-optical devices. Namely, the present invention may be embodied in all the electronic equipments that incorporate those electro-optical devices as display medium.

As such an electronic equipment, a video camera, a digital camera, a head mount display (goggle-type display), a wearable display, a navigation system for vehicles, a personal computer, and a portable information terminal (a mobile computer, a cellular phone, or an electronic book, etc.) may be enumerated. Examples of those are shown in FIGS. 30A to 30F.

Figure 30A:
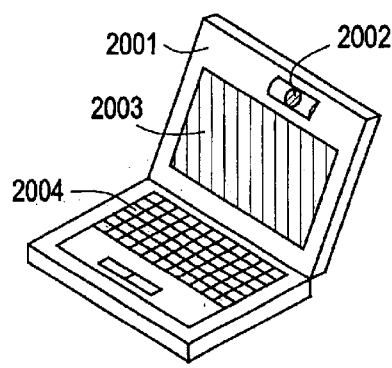
FIGS. 30A to 30F are diagrams showing examples of an electronic device.

FIG. 30A shows a personal computer comprising a main body 2001, an image inputting portion 2002, a display portion 2003, and a key board 2004. The present invention is applicable to the image inputting portion 2002, the display portion 2003, and other signal control circuits.

Figure 30B:
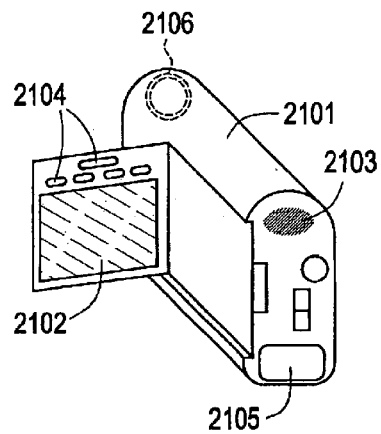

FIG. 30B shows a video camera comprising a main body 2101, a display portion 2102, a voice input portion 2103, operation switches 2104, a battery 2105, and an image receiving portion 2106. The present invention is applicable to the display portion 2102, the voice input portion 2103, and other signal control circuits.

Figure 30C:
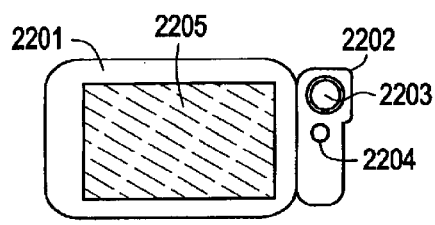

FIG. 30C shows a mobile computer comprising a main body 2201, a camera portion 2202, an image receiving portion 2203, an operation switch 2204, and a display portion 2205. The present invention is applicable to the display portion 2205 and other signal control circuits.

Figure 30D:
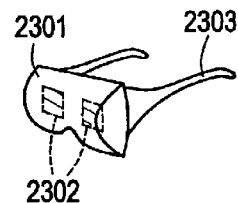

FIG. 30D shows a goggle-type display comprising a main body 2301, a display portion 2302 and arm portions 2303. The present invention is applicable to the display portion 2302 and other signal control circuits.

Figure 30E:
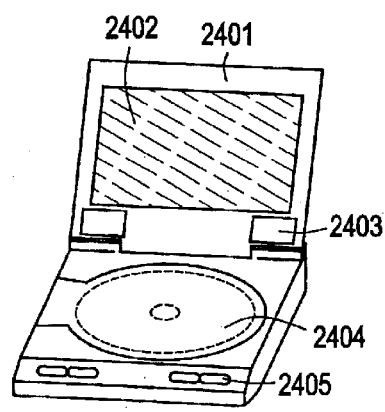

FIG. 30E shows a player that employs a recording medium in which programs are recorded (hereinafter referred to as a recording medium), and comprises a main body 2401, a display portion 2402, a speaker portion 2403, a recording medium 2404, and an operation switch 2405. Incidentally, this device uses as the recording medium a DVD (digital versatile disc), a CD and the like to serve as a tool for enjoying music or movies, for playing video games and for connecting to the Internet. The present invention is applicable to the display unit 2402 and other signal control circuits.

Figure 30F:
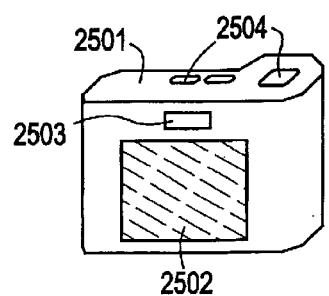

FIG. 30F shows a digital camera comprising a main body 2501, a display unit 2502, an eye piece section 2503, operation switches 2504, and an image receiving unit (not shown) and the like. The present invention is applicable to the display portion 2502 and other signal control circuits.

As described above, application fields of the present invention is extremely broad, and is capable of being applied to every field of electronic equipment. In addition, the electronic equipment according to the present embodiment can be embodied by using any constitution comprising any combination of Embodiment 1 to 12.

Embodiment 15

TFTs formed through carrying out the present invention may be applied to various electro-optical devices. Namely, the present invention may be embodied in all the manufacturing processes for the electronic equipments that incorporate those electro-optical devices as display medium.

As such an electronic equipment, a projector (rear type or front type or the like) may be enumerated. Examples of those are shown in FIGS. 31A to 31D.

Figure 31A:
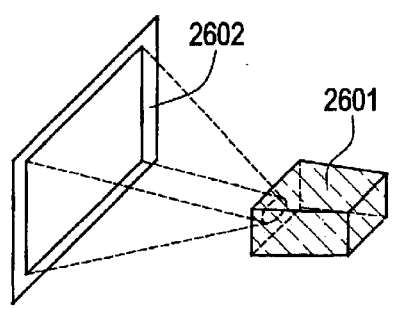
FIGS. 31A to 31D are diagrams showing examples of an electronic device.

FIG. 31A shows a front-type projector comprising a display device 2601, a screen 2602. The present invention is applicable to a display device and other signal control circuits.

Figure 31B:
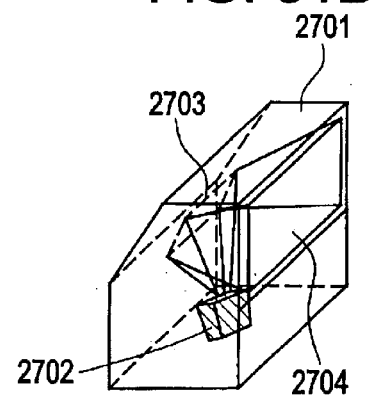

FIG. 31B shows a rear-type projector comprising a main body 2701, a display device 2702, a mirror 2703, and a screen 2704. The present invention is applicable to the display device and other signal control circuits.

Figure 31C:
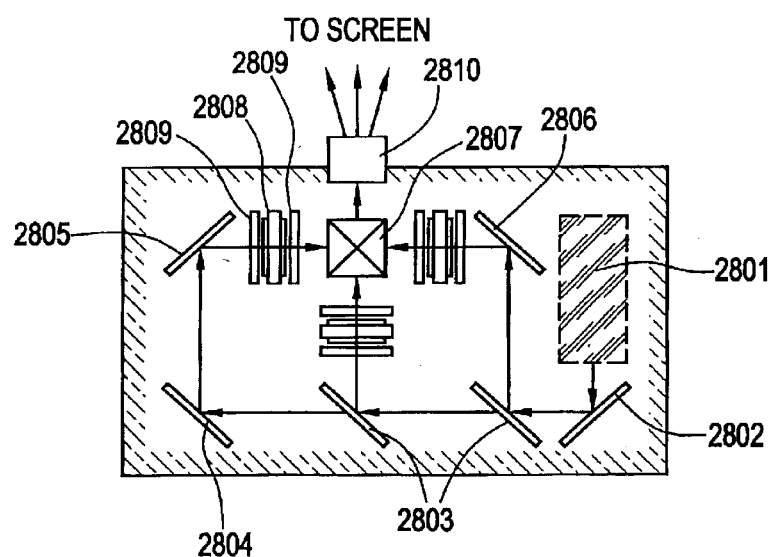

FIG. 31C is a diagram showing an example of the structure of the display devices 2601 and 2702 in FIGS. 31A and 31B. The projection device 2601 or 2702 comprises a light source optical system 2801, mirrors 2802 and 2804 to 2806, dichroic mirrors 2803, a prism 2807, liquid crystal display device 2808, phase difference plates 2809, and a projection optical system 2810. The-projection optical system 2810 consists of an optical system including a projection lens. This embodiment shows an example of three plate type, but is not particularly limited thereto. For instance, the invention may be applied also to single plate type. Further, in the light path indicated by an arrow in FIG. 31C, an optical system such as an optical lens, a film having a polarization function, a film for adjusting a phase difference and an IR film may be provided on discretion of a person who carries out the invention.

Figure 31D:
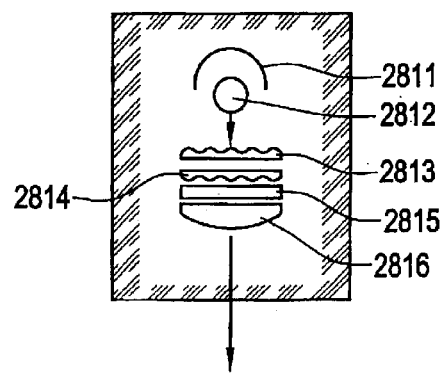

FIG. 31D is a diagram showing an example of the structure of the light source optical system 2801 in FIG. 31C. In this embodiment, the light source optical system 2801 comprises a reflector 2811, light source 2812, lens arrays 2813 and 2814, a polarization conversion element 2815, and a condenser lens 2816. The light source optical system shown in FIG. 31D is an example thereof, and is not particularly limited. For instance, on discretion of a person who carries out the invention, the light source optical system may be provided with an optical system such as an optical lens, a film having a polarization function, a film for adjusting the phase difference and an IR film.

As described above, application fields of the present invention is extremely broad, thereby being capable of applying the present invention to every field of electronic equipment. In addition, the electronic equipment according to the present embodiment can be embodied by using any constitution comprising any combination of Embodiment 1 to 12.

Embodiment 16

Figure 32:
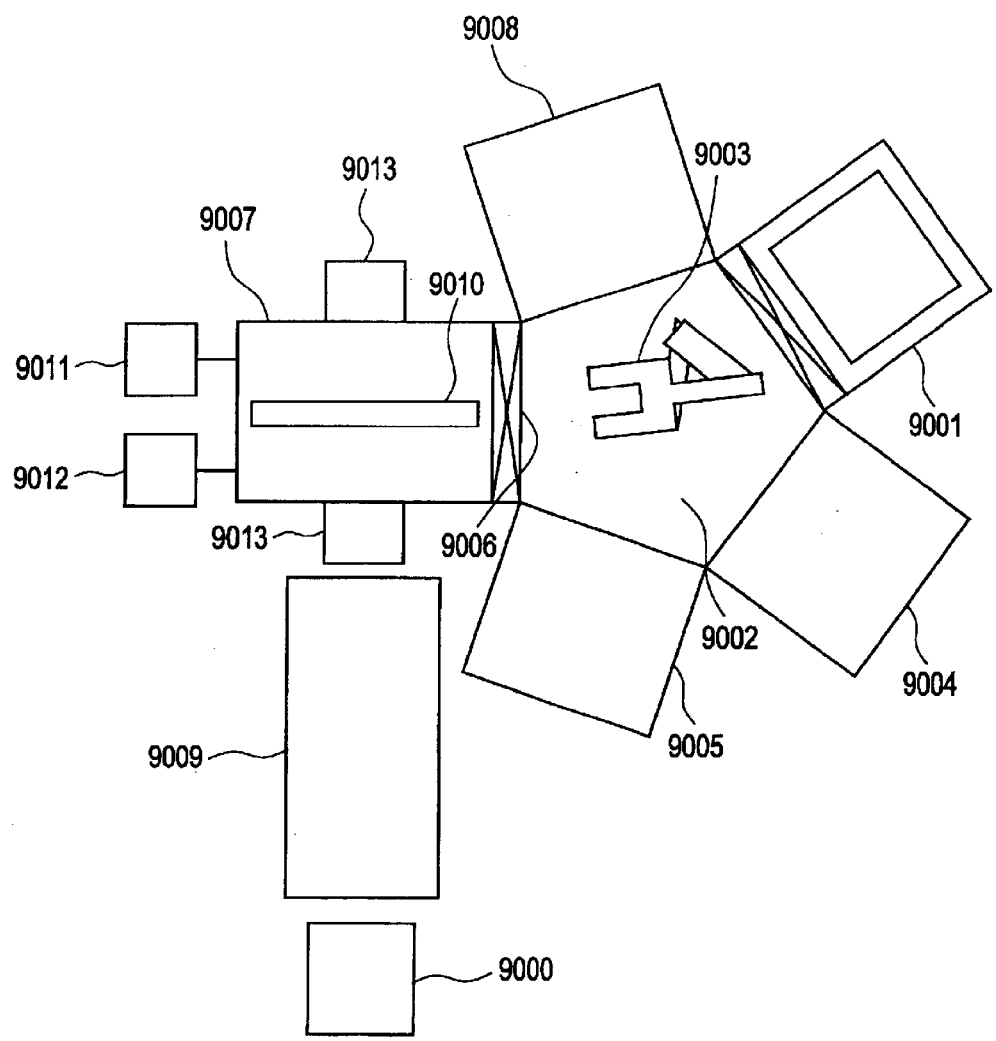
FIG. 32 is a diagram showing a laser irradiation system in accordance with one embodiment of the present invention.

The Embodiment 16 is directed to a laser irradiation system utilizing the laser irradiation apparatus of the present invention for mass production. FIG. 32 is a top view of the laser irradiation system of this embodiment.

A substrate is transferred from a load/unload chamber 9001 by a robot arm 9003 provided in a transfer chamber 9002. At first, the substrate is aligned to a proper position in an alignment chamber 9004 and then it is transferred to a preheat chamber 9005 where the substrate is heated to a predetermined temperature, for example, 300° C. by using an infrared lamp heater. Thereafter, the substrate is transferred to a laser irradiation chamber 9007 through a gate valve 9006, following which the gate valve 9006 is closed.

The laser beam emitted from the oscillator 9000 is directed to the substrate provided in the laser irradiation chamber 9007 through an optical system 9009 and a quartz window 9010. Any optical system which has been described in the preferred embodiments, for example, that shown in FIGS. 3 to 13 may be used as the optical system 9009.

Before the irradiation of the laser beam, the laser irradiation chamber may be evacuated to a high degree of a vacuum, for example, to $10^{-3}$ Pa by using a vacuum pump 9011. Alternatively, the irradiation chamber is provided with a desired atmosphere by using the vacuum pump 9011 and a gas bomb 9012.

The substrate is scanned by utilizing the moving mechanism 9013 while irradiating the line-shaped laser beam, thereby, irradiating the entire surface of the substrate with the laser beam. Optionally, an infrared light may be simultaneously directed to a portion of the substrate irradiated with the laser beam by using an IR lamp.

After the irradiation of the laser beam, the substrate is transferred to a cooling chamber 9008 where the substrate is gradually cooled, and then the substrate is returned to the load/unload chamber 9001 through the alignment chamber 9004. By repeating the foregoing steps, many substrates can be treated with the laser beam efficiently.

By using the laser irradiation apparatus of the present invention, the conventionally observed faint interference can be reduced. Besides, it is possible to simplify the optical system in which adjustment has been conventionally difficult.

Further, although a lens through which a laser beam is transmitted is deteriorated and becomes unusable as it is used, a mirror is different from the lens since the laser beam does not transmit but the laser beam is reflected on the surface of the mirror, so that the deterioration is restricted to only the surface. Thus, even if the mirror is used for a long term, if coating of the surface of the mirror is again made, it can be used again and is economical. Besides, the mirror is effective since aberration as in the lens is not produced. Further, if the mirror is made a movable one by a micrometer or the like, a fine adjustment becomes possible, which is convenient.

In the preferred embodiments as described above, a line-shaped laser beam (linear laser beam) or a rectangular-shaped laser beam are mainly described. However, the optical system of the present invention can be applied to other types of laser beams having a different beam shape. Also, in the preferred embodiments described above, the optical system of the present invention is used to reduce the interference in a width direction of a line-shaped laser beam. However, if desired, it is possible to reduce an interference in a length-wise direction of the line-shaped laser beam by utilizing a similar optical system of the present invention. Also, it is to be understood that the beam collimator is not limited to the particular structures disclosed in the preferred embodiments of the invention. Further, if a laser beam having an enough small divergent can be obtained, the present invention can be achieved without using a beam collimator.

What is claimed is:

1. A laser irradiation apparatus for irradiating a laser beam having a linear or rectangular shape on an irradiation surface, comprising:
   a laser oscillator;
   an optical system for transforming the shape of the laser beam on the irradiation surface into the linear or rectangular shape; and
   a stage moving in at least one direction;
   wherein the optical system includes,
   in a width direction of the laser beam,
   a first optical system serving to convert the laser beam into a parallel light with respect to a traveling direction of the laser beam, and
   a second optical system serving to divide the laser beam of the parallel light into plural beams, to unite them to make one beam at the irradiation surface, and to unify energy of the laser beam in which the shape on the irradiation surface becomes linear or rectangular, and
   in a longitudinal direction of the laser beam,
   a third optical system serving to divide the laser beam into plural beams in a direction perpendicular to the traveling direction of the laser beam, and
   a fourth optical system serving to unite the divided laser beams to make one beam at the irradiation surface, and to unify energy of the laser beam in which the shape on the irradiation surface becomes linear or rectangular, and
   means for making differences between optical paths from outlets of the respective laser beams divided by the second optical system to the irradiation surface longer than a coherent length of the laser beam.

2. A laser irradiation apparatus for irradiating a laser beam having a linear or rectangular shape on an irradiation surface, comprising:
   a laser oscillator;
   an optical system for transforming the shape of the laser beam on the irradiation surface into the linear or rectangular shape; and a stage moving in at least one direction;

wherein the optical system includes, in a width direction of the laser beam, a first cylindrical array lens and a first cylindrical lens serving to convert the laser beam into a parallel light with respect to a traveling direction of the laser beam, and a mirror serving to divide the laser beam of the parallel light into plural beams, to unite them to make one beam at the irradiation surface, and to unify energy of the laser beam in which the shape on the irradiation surface becomes linear or rectangular, and in a longitudinal direction of the laser beam, a second cylindrical array lens serving to divide the laser beam into plural beams in a direction perpendicular to the traveling direction of the laser beam, and a second cylindrical lens serving to unite the divided laser beams to make one beam on the irradiation surface and to unify energy of the laser beam in which the shape on the irradiation surface becomes linear or rectangular, and means for making differences between optical paths from outlets of the respective laser beams reflected by the mirror to the irradiation surface longer than a coherent length of the laser beam.

3. A laser irradiation apparatus according to claim 1, wherein said second optical system includes a combination of a plurality of mirrors.

4. A laser irradiation apparatus according to claim 1, wherein the longitudinal direction of the laser beam in which the shape of the laser beam on the irradiation surface becomes linear or rectangular is perpendicular to an operation direction of the stage moving in at least the one direction.

5. A laser irradiation apparatus according to claim 2, wherein the longitudinal direction of the laser beam in which the shape of the laser beam on the irradiation surface becomes linear or rectangular is perpendicular to an operation direction of the stage moving in at least the one direction.

6. A laser irradiation apparatus according to claim 1, wherein the laser irradiation apparatus includes a load/unload chamber, a robot arm, and a laser irradiation chamber.

7. A laser irradiation apparatus according to claim 2, wherein the laser irradiation apparatus includes a load/unload chamber, a robot arm, and a laser irradiation chamber.

8. A laser irradiation apparatus comprising:

a laser oscillator for producing a laser beam;

at least first and second mirrors to divide said laser beam into at least first and second divided laser beams wherein said first and second mirrors are so arranged that the divided laser beams are directed to a same irradiation surface of an object and united as one beam at said surface wherein a difference of optical path lengths of said first and second divided laser beams between said surface and said first and second mirrors is larger than a coherent length of said laser beam as emitted from said laser oscillator.

9. The laser irradiation apparatus according to claim 8 further comprising a beam collimator between said laser oscillator and said first and second mirrors.

10. A laser irradiation method comprising:

emitting a laser beam from a laser oscillator;

dividing said laser beam to at least first and second divided laser beams;

directing said first and second divided laser beams to a same portion of an object to obtain one united laser beam at said object;

moving said object relative to said united laser beam, wherein a difference of optical path lengths between said first and second divided laser beams is larger than a coherent length of said laser beam.

11. The laser irradiation method according to claim 10 further comprising irradiating a semiconductor film with said united laser beam for crystallizing said semiconductor film.

12. The laser irradiation method according to claim 10 further comprising making said laser beam as emitted from said laser oscillator a parallel laser beam before the step of dividing said laser beam.

13. A laser irradiation apparatus comprising:

a laser oscillator for producing a laser beam having a cross section perpendicular to a propagation direction of the laser beam;

at least one cylindrical lens array to expand the cross section of said laser beam only in a direction along a longitudinal direction of said cross section;

at least first and second mirrors to divide said laser beam into at least first and second divided laser beams in a width direction of the cross section wherein said first and second mirrors are so arranged that the divided laser beams are directed to a same portion of an object and united as one beam at said portion wherein a difference of optical path lengths of said first and second divided laser beams between said portion and said first and second mirrors is larger than a coherent length of said laser beam as emitted from said laser oscillator.

14. The laser irradiation apparatus according to claim 13 further comprising a beam collimator between said laser oscillator and said first and second mirrors.

* * * * *